United States Patent [19]

Majima et al.

[11] Patent Number: 5,552,919
[45] Date of Patent: Sep. 3, 1996

[54] TUNABLE-FILTER CONTROL METHOD, TUNABLE-FILTER CONTROL APPARATUS AND OPTICAL COMMUNICATION SYSTEM USING THE SAME

[75] Inventors: Masao Majima, Isehara; Takeo Ono, Sagamihara, both of Japan

[73] Assignee: Canon Kabushiki Kaisha, Tokyo, Japan

[21] Appl. No.: 541,721

[22] Filed: Oct. 10, 1995

Related U.S. Application Data

[63] Continuation of Ser. No. 79,749, Jun. 22, 1993, abandoned.

[30] Foreign Application Priority Data

Jun. 27, 1992 [JP] Japan ................................. 4-192900
May 31, 1993 [JP] Japan ................................. 5-152670

[51] Int. Cl.$^6$ ................................................. H04B 10/00
[52] U.S. Cl. .......................... 359/161; 359/124; 359/110
[58] Field of Search ................................. 359/110, 124, 359/161, 173, 154, 194, 325, 339, 189

[56] References Cited

U.S. PATENT DOCUMENTS 5,018,130  5/1991  Suzuki et al. ........................... 359/124
5,483,370  1/1996  Takahashi ............................... 359/124

FOREIGN PATENT DOCUMENTS 2135830  5/1990  Japan .

OTHER PUBLICATIONS

Patel et al., "Frequency Locking Of A Tunable Liquid-Crystal Filter", Journal Of Applied Physics, vol. 71, No. 5 (New York, US), Mar. 1, 1992, pp. 2464–2466.

Chawki et al., "Multielectrode DFB Lasers used as Tunable FM Receiver at 1.5 μm", Journal Of Optical Communications, vol. 11, No. 3 (Berlin De), Sep. 1990, pp. 98–100.

Miller, C. M., et al., Passively Temperature–Compensated Fibre Fabry–Perot Filter and Its Application in Wavelength Division Multiple Access Computer Network, Electronics Letters, IEE, vol. 26, No. 25, Dec. 6, 1990, pp. 2122–2123.

Terakado, Tomoji, et al., Optical Filter Using DFB–LD, 1985 National Conference on the Institute of Electronics and Communication Engineers of Japan, Semiconductor Devices and Material Section, pp. 1–141, 1985 (and English translation).

*Primary Examiner*—Leo Boudreau
*Assistant Examiner*—Kinfe-Michael Negash
*Attorney, Agent, or Firm*—Fitzpatrick, Cella, Harper & Scinto

[57] ABSTRACT

A tunable-filter control method or apparatus tracks a central wavelength in a transmission spectrum of a tunable-filter to a wavelength of light to be received. The central wavelength in the transmission spectrum of the tunable-filter is periodically and minutely modulated. An error signal is generated for use in tracking the central wavelength to the wavelength of the light to be received, by using a tunable-filter output which exhibits the effect of the minute modulation of the central wavelength. A tracking condition, which corresponds to one of a draw-in state and a stable state, is monitored to control the modulation of the central wavelength based on a result of the monitoring, so that a modulation amplitude of the central wavelength in the minute modulation is increased at the time of the draw-in state of the tracking condition and is decreased at the time of the stable state of the tracking condition. A phase of an intensity modulation component of a transmission light transmitted through the tunable-filter may be compared with a phase of a modulation signal used for the minute modulation. In this case, the error signal is generated based on a result of the comparison.

78 Claims, 13 Drawing Sheets

TUNABLE-FILTER CONTROL METHOD, TUNABLE-FILTER CONTROL APPARATUS AND OPTICAL COMMUNICATION SYSTEM USING THE SAME

This application is a continuation of application Ser. No. 08/079,749 filed Jun. 22, 1993, now abandoned.

BACKGROUND OF THE INVENTION

1. Field of the Invention

The present invention relates to a tunable-filter control method and apparatus, which are usable in communication systems such as wavelength division multiplexing (WDM) communication systems, and to an optical communication system which uses the tunable-filter control method or apparatus in a receiver unit.

2. Related Background Art

In recent years, as multimedia systems for data or other information have been developed, studies have been conducted regarding possible communication systems for implementing such multimedia systems. Optical communication systems, such as subscriber line systems and local area networks (LAN), are one type of system that has been studied. In particular, WDM communication is one such optical communication system, in which a large number of independent channels can be established in a single transmission line or optical fiber. WDM communication offers both the high-speed characteristics that are inherent in an optical communication system and flexibility of communication. Therefore, WDM communication has come into wide use as a communication system which transmits or exchanges high-speed information and which has a large capacity. As a component of such a WDM system, tunable or wavelength-changeable filters are widely known.

The tunable filter is an indispensable element for use in WDM optical communication systems, and performs a function of selecting a light signal at one wavelength from a plurality of wavelength-multiplexed light signals. In an optical communication system which utilizes a small number of wavelengths (e.g., several wavelengths), and which has a wide wavelength interval between channels, dielectric multi-layer fixed filters may be adopted as such a tunable filter.

On the other hand, in an optical communication system which utilizes a large number of wavelengths where the interval between multiplexed wavelengths is narrow, a filter is needed which can vary its filtering wavelength and which has a narrow transmission wavelength width. As such a kind of tunable filter, a filter having a distributed feedback laser diode (DFB-LD) structure, or a DFB filter, as it is commonly known. A DFB filter is disclosed, for example, in Preliminary Papers of Division Conference, Lecture No. 326, Japan Electronics Communication Academy, 1985. In DFB filters, a central wavelength in a transmission spectrum (also referred to as a central wavelength) can be controlled by changing a bias current of the filter in a range below a losing threshold. The DFB filter can serve as an optical amplifier in the vicinity of its central wavelength.

However, the central wavelength of a DFB filter is dependent on temperature, and on top of that, DFB filters each have different correlation characteristics between bias current and central wavelength. Therefore, when a DFB filter is used in a WDM communication system, a tracking control system is needed in which the central wavelength in the transmission spectrum of the DFB filter is drawn into a target received wavelength and stabilized thereat. A prior art tunable-filter control system will be described in the following.

This prior art is based on the disclosure in the periodical: "Electronics Letters", Vol. 26, No. 25, pp. 2122–2123, December, 1990. FIG. 1 shows this tunable filter control system. A light signal transmitted through a tunable filter 811 enters a light receiving element 813. The light signal is converted to an electric signal by the light receiving element 813, and the electric signal is amplified by an amplifier 814. Only a modulation component of the electric signal is further amplified by a narrow band amplifier 810 for amplifying only a frequency component near a frequency f, and the output of amplifier 810 is input to a synchronous detector or detection circuit 820. The synchronous detection circuit 820 detects the modulation component signal in synchronization with a modulation signal supplied from a sinusoidal wave generator or oscillator 819 through a delay circuit 825. Only a low frequency component of an output from the synchronous detection circuit 820 is amplified by an integrator 830. The time constant of the integrator 830 is set to a value sufficiently larger than the period of the above-mentioned modulation signal.

A feedback control circuit 817 generates a control signal by using the low frequency component as an error signal. A filter driver or control circuit 818 generates an output based on three input signals consisting of an offset signal from a receiver portion, the modulation signal from the sinusoidal wave oscillator 819 and the control signal from the feedback control circuit 817, and supplies the output to the tunable filter 811. Thus, the central wavelength in the transmission spectrum of the tunable filter 811 is controlled. The sinusoidal wave oscillator 819 generates the modulation signal, which is a sinusoidal wave of the frequency f, and supplies the modulation signal to both the filter driver 818 and the synchronous detection circuit 820.

FIG. 2 is a graph illustrating a relation between the transmission spectrum of the tunable filter 811 and a wavelength $\lambda s$ of a received signal. In FIG. 2, symbol $\lambda c$ designates the central wavelength of the transmission spectrum of the tunable filter 811. The central wavelength $\lambda c$ is drawn-in from left to right in the case of $\lambda c < \lambda s$, and from right to left in the case of $\lambda c > \lambda s$, by the tracking operation. A range, in which the draw-in is possible, is a range between locations that are slightly shifted toward a peak of the transmission spectrum of the tunable filter 811 from respective feet thereof. The range is determined by characteristics of the control system. This range will hereinafter be referred to as a draw-in range.

The central wavelength of the transmission spectrum of the tunable filter 811 is modulated (i.e., varied) by the sinusoidal modulation signal, from the sinusoidal oscillator 819, input into the filter driver 818. The modulation amplitude of the central wavelength is sufficiently smaller than the width of the transmission spectrum of the tunable filter 811. For example, the former is a value less than a tenth of the value of the latter. A change in the central wavelength $\lambda c$ of the transmission spectrum of the tunable filter 811 is converted to a change in the amount of light at the wavelength $\lambda s$ that is transmitted through the tunable filter 811, and is further converted to an electric signal by the light receiving element 813. The phase of a sinusoidal wave of a frequency f contained in that electric signal is opposite in the case of $\lambda c < \lambda s$ from the case of $\lambda c > \lambda s$.

The low frequency component of the output from the synchronous detection circuit 820 (i.e., the output from the

3 integrator 830) is positive when two inputs of the synchronous detection circuit 820 are in phase with each other, while negative when the phases of those two inputs are opposite to each other. When the above-mentioned electric signal and the output of the sinusoidal wave oscillator 819 are those two inputs, the polarity (positive or negative) of the output from the integrator 830 is opposite in the case of $\lambda c<\lambda s$ from the case of $\lambda c>\lambda s$. The central wavelength $\lambda c$ of the transmission spectrum can be drawn-in to the wavelength $\lambda s$ of the received signal and stabilized thereat by performing feedback control based on the signal from the integrator 830, which serves as an error signal.

In the above-discussed prior art tunable-filter tracking control system, however, a periodic fluctuation of the central wavelength of the transmission spectrum due to the modulation by the modulation signal exists even after the central wavelength $\lambda c$ of the tunable filter 811 has been drawn-in to the wavelength $\lambda s$ of the received light signal (referred to as a stable state). The fluctuation of the central wavelength of the transmission spectrum will be converted to a fluctuation of an intensity of light which is incident on the light receiving element 813 through the transmission spectrum of the tunable filter 811. As a result, when the fluctuation of the light intensity is great, reception sensitivity will be degraded. In order to decrease the fluctuation of the light intensity, it would be necessary to reduce the modulation amplitude of the central wavelength $\lambda c$ of the tunable filter 811. In this case, however, the error signal at the draw-in time would lessen, and the response characteristics of the draw-in would be degraded.

SUMMARY OF THE INVENTION

It is an object of the present invention to provide a tunable filter control system or method, control apparatus and an optical communication system using the control system or apparatus, in which a large error signal can be obtained at a draw-in time and a periodic fluctuation of a transmission wavelength due to modulation of a central wavelength of a transmission spectrum can be reduced at a stable time.

According to one aspect of the present invention, a tunable-filter control method for tracking a central wavelength in a transmission spectrum of a tunable filter to a wavelength of light to be received, includes: modulating a central wavelength in a transmission spectrum of a tunable filter; generating an error signal for use in tracking the central wavelength to a wavelength of light to be received by using an output of the tunable filter, which exhibits an effect of the modulating step; monitoring a tracking state which corresponds to one of a draw-in state and a stable state; increasing a modulation amplitude of the central wavelength in the modulating step at the time of the draw-in state of the tracking state, based on a result of the monitoring step; and decreasing the modulation amplitude of the central wavelength at the time of the stable state of the tracking state, based on the result of the monitoring step.

A tunable-filter control system according to the present invention may further comprise a step of comparing a phase of an intensity modulation component of a light transmitted through the tunable filter with a phase of a modulation signal used in the modulating step, and in this case the error signal is generated based on a result of the comparing step.

According to another aspect of the present invention, a tunable-filter control apparatus for tracking a central wavelength in a transmission spectrum of a tunable filter to a wavelength of light to be received, includes a tunable filter having a variable central wavelength in a transmission spectrum, a modulation signal supplying unit for supplying a modulation signal for modulating the central wavelength in the transmission spectrum of the tunable filter, an error signal generating unit for generating an error signal for use in tracking the central wavelength to the wavelength of the light to be received, by using an output of the tunable filter, a filter control unit for tracking the central wavelength of the tunable filter to the wavelength of the light to be received, based on the error signal from the error signal creating unit, using feedback control, and a monitoring unit for monitoring a tracking state which corresponds to one of a draw-in state and a stable state to and for controlling the modulation signal supplying unit to increase a modulation amplitude of the central wavelength of the tunable filter at the time of the draw-in state of the tracking state and to decrease the modulation amplitude at the time of the stable state of the tracking state.

A tunable-filter control apparatus according to the present invention may further include a unit for extracting an intensity modulation component of a light transmitted through the tunable filter, and in this case the error signal generating unit generates the error signal by comparing a phase of the intensity modulation component of the light transmitted through the tunable filter with a phase of the modulation signal from the modulation signal supplying unit.

According to another aspect of the present invention, an optical communication system includes a light transmission line, a transmitter unit for transmitting a light signal through the light transmission line, and a receiver unit for receiving the light signal. The receiver unit includes a tunable filter control apparatus of the present invention, or adopts a tunable-filter control method of the present invention.

These advantages and others will be more readily understood in connection with the following detailed description of the preferred embodiments in conjunction with the drawings.

DESCRIPTION OF THE PREFERRED EMBODIMENTS

First Embodiment

A first embodiment of a tunable-filter control system or apparatus according to the present invention will be described with reference to FIGS. 3 and 4.

Figure 1:
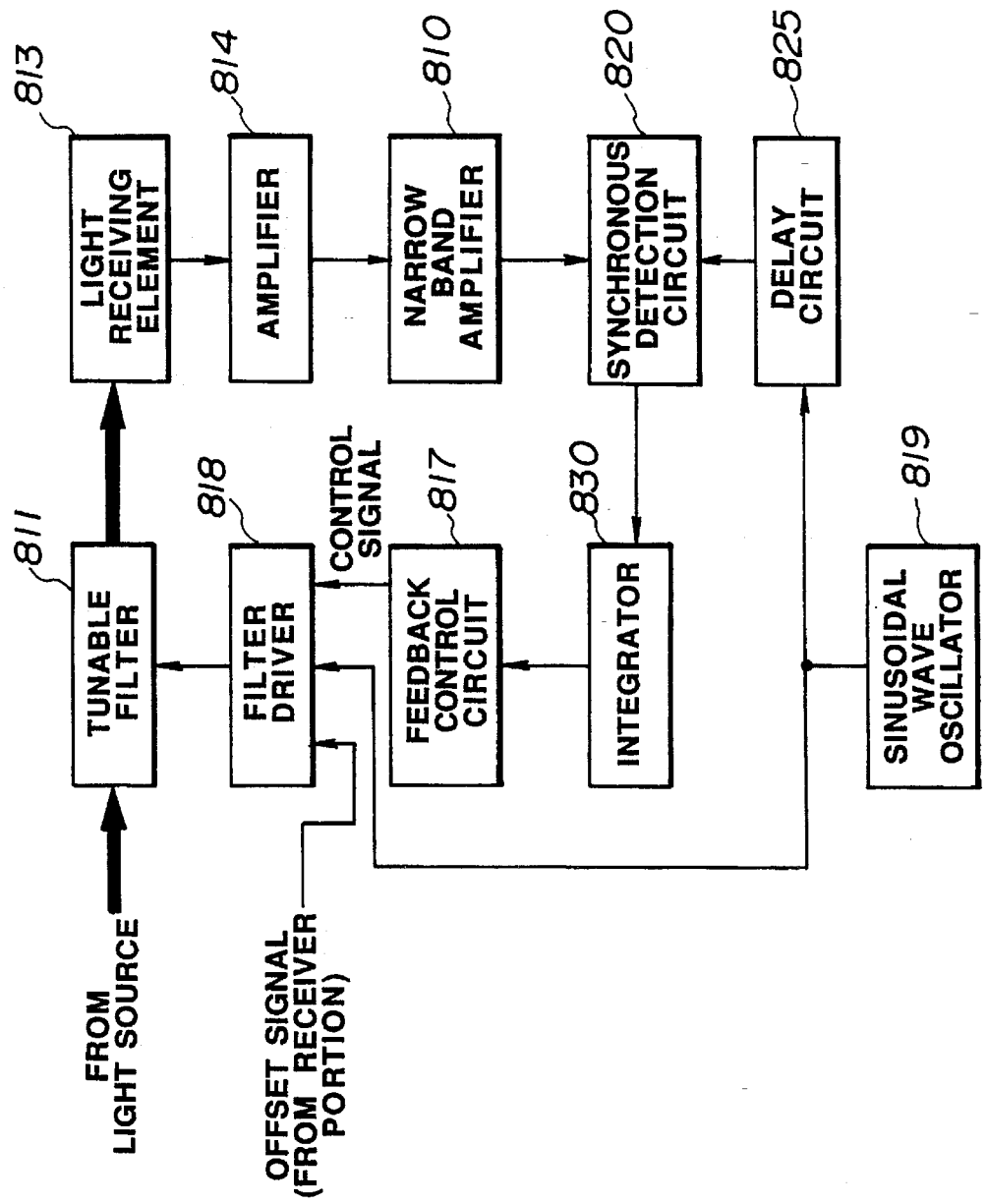
FIG. 1 is a block diagram of a prior art tunable filter control system.
Figure 2:
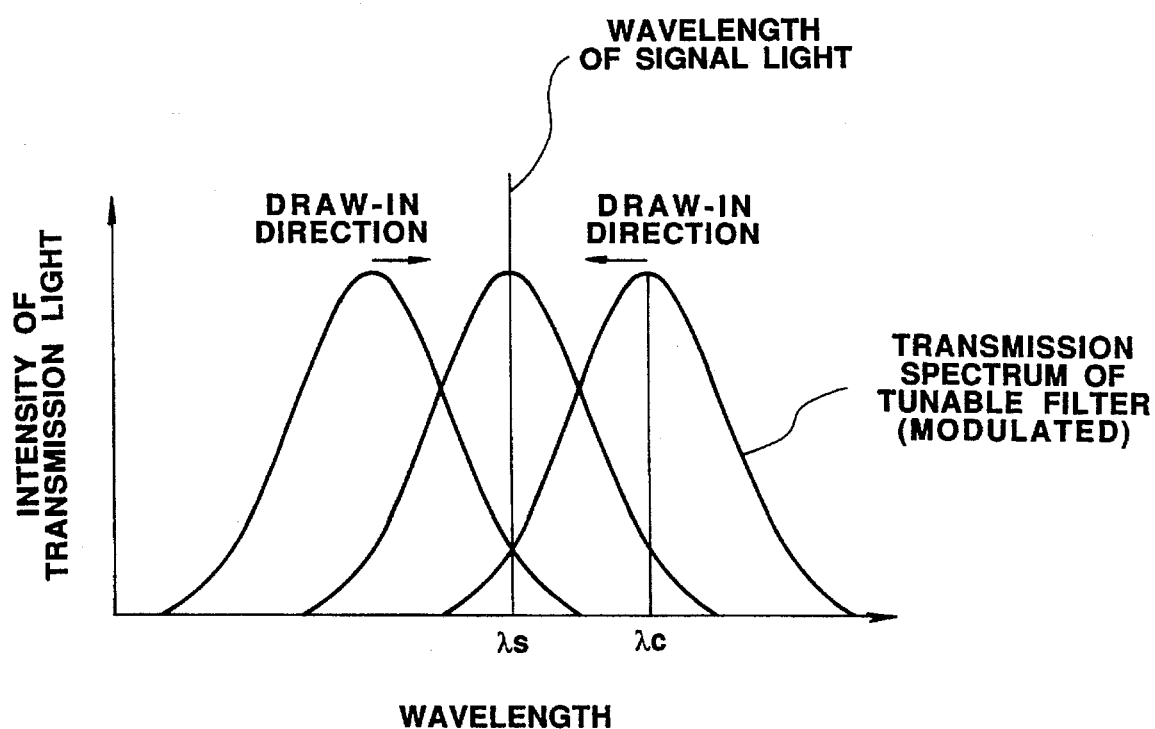
FIG. 2 is a graph illustrating a relation between a transmission spectrum of a distributed feedback (DFB) filter and a wavelength of a light signal.
Figure 3:
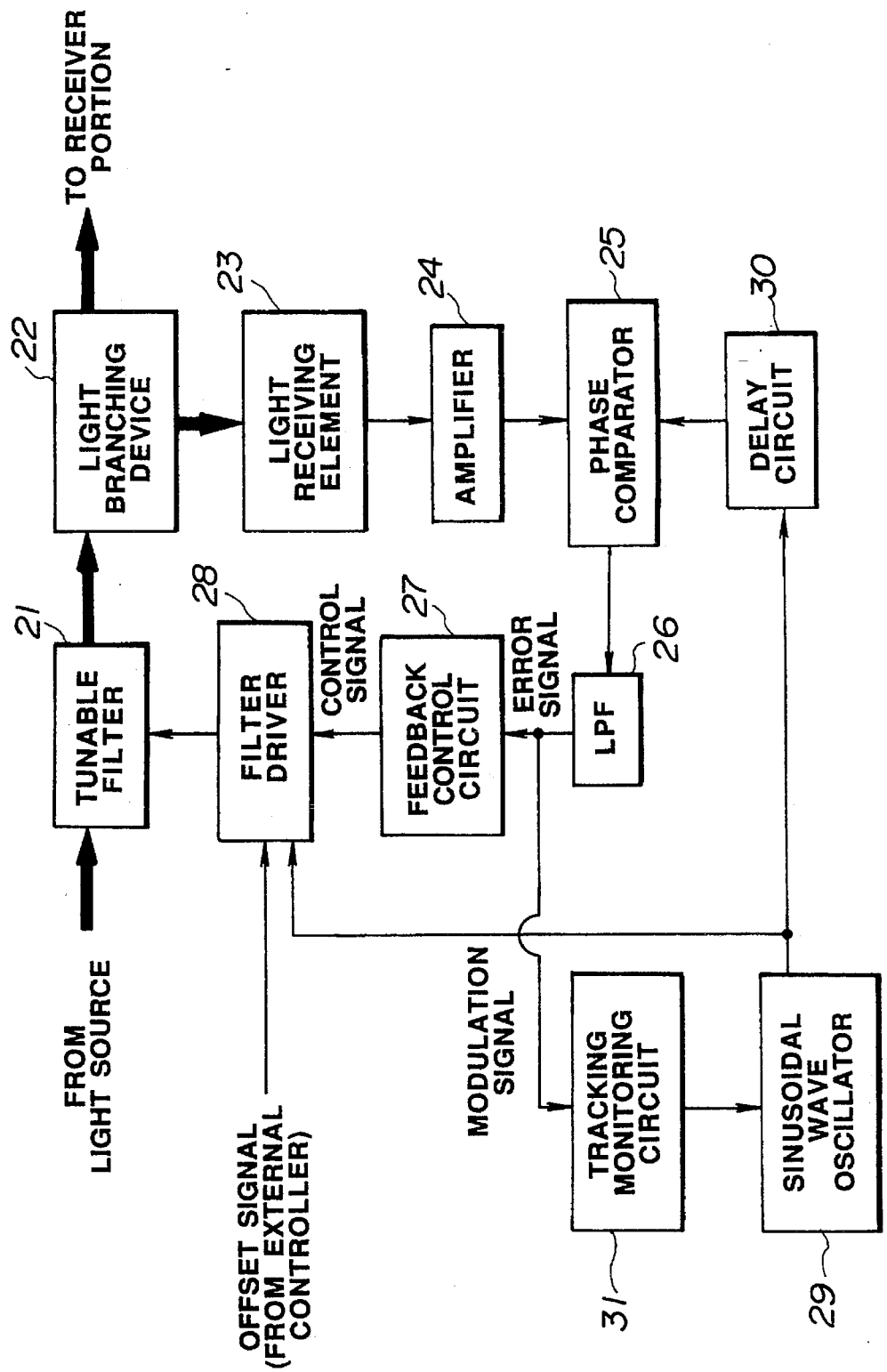
FIG. 3 is a block diagram showing a first preferred embodiment of a tunable-filter control system or apparatus according to the present invention.

In FIG. 3, a main portion of a control system of this embodiment is made up of a tunable filter 21, a light branching device 22, a light receiving element or device 23, an amplifier 24, a phase comparator or comparing circuit 25, a low pass filter (LPF) 26, a feedback control circuit 27, a filter driver or control circuit 28, a sinusoidal wave oscillator 29 for generating a modulation signal, a delay circuit 30 and a tracking monitoring circuit 31. The tunable filter 21, light branching device 22, light receiving element 23, amplifier 24, phase comparator 25, LPF 26, feedback control circuit 27, filter driver 28, delay circuit 30 and other devices respectively have the following structures and operations.

The tunable filter 21 is comprised of a DFB filter whose bias current can control a central wavelength of its transmission spectrum. A plurality of electrodes for injecting current therethrough may be arranged on the DFB filter 21 to widen a range of its tunable filtering wavelength. The DFB filter is disclosed, for example, in Journal: Paper of Japan Electronics Information Communication Academy, C-1, J73-C-1, No. 5, pp. 347–353 (May, 1990).

The light branching device 22 branches a portion of light transmitted through the tunable filter 21 for use in tracking. The light receiving element 23 converts the portion of the light signal separated by the light branching device 22 for use in tracking into an electric signal, and the amplifier 24 amplifies the electric signal.

The phase comparing circuit 25 serves as a circuit for comparing the phase of the amplified signal from the amplifier 24 with the phase of a modulation signal to be used for a minute modulation of the tunable filter 21. The modulation signal is input from the sinusoidal wave oscillator 29 through the delay circuit 30. The phase comparing circuit 25 is preferably made up of a multiplier. The level of a DC component of the output signal of the phase comparing circuit 25 is positive when its two input signals (i.e., the amplified signal from the amplifier 24 and the modulation signal from the sinusoidal wave oscillator 29) are in phase with each other, while negative when phases of the two input signals are opposite to each other.

The LPF 26 is a filter for extracting a DC component from the output signal of the phase comparator 25, and its cut-off frequency is properly set so that the minute modulation of a frequency f superposed on the bias current injected into the tunable filter 21 can be sufficiently reduced.

The feedback control circuit 27 generates a control signal when a DC signal is input thereinto from the LPF 26. A well-known proportional-integral-differential (PID) control is preferably adopted as a feedback control system. The filter driver 28 is supplied with the control signal, the modulation signal from the sinusoidal wave oscillator 29 and an offset signal, and thus its output current is controlled. Input and interception of the control signal, the modulation signal and the input level of the offset signal are controlled by an external control circuit or controller.

When a multi-electrode DFB filter is used as the tunable filter 21, the number of output currents from the filter driver 28 is the same as the number of the electrodes, and the central wavelength of the tunable filter 21 can be changed by controlling bias currents applied to each of the respective electrodes. The modulation in transmission wavelength of the tunable filter 21 for tracking is performed by superposing a sinusoidal wave current of a minute amplitude on the bias current applied to one electrode of the tunable filter 21. The sinusoidal wave oscillator 29 generates the modulation signal for such a minute modulation. An upper limit of the modulation frequency f is determined from a transmission speed of a signal at a wavelength transmitted at this time, and a lower limit thereof is determined from a response speed of tracking. The frequency usually lies within a range from several hundred Hz to several kHz. The delay circuit 30 delays the modulation signal from the sinusoidal wave oscillator 29 and supplies the delayed signal to the phase comparator 25. Thus, a phase relation between the modulation signal and the amplified signal from the amplifier 24 are adjusted in the phase comparator 25.

The sinusoidal wave oscillator 29 generates the modulation signal for minutely modulating the tunable filter 21, as discussed above. Its output amplitude is established by adding a value controlled by the tracking monitoring circuit 31 to an initial value, and its frequency f is as noted above. The tracking monitoring circuit 31 receives the error signal from the feedback control circuit 27, and outputs a signal to the sinusoidal wave oscillator 29 when the absolute value of the error signal becomes smaller than a predetermined value. Thus, the amplitude of the sinusoidal wave is suppressed in the sinusoidal wave oscillator 29. The details will be described below. The control (i.e., ON and OFF) of the tracking monitoring circuit 31 is performed by the external control circuit.

The basic principle of the control system performed in the above-discussed tunable filter 21 is as follows:

It is assumed that the central wavelength $\lambda c$ of the tunable filter 21 is initially set to a value near a wavelength of a light signal to be received, by the level of the offset signal input into the filter driver 28, prior to the tracking operation. No control and modulation signals are input into the filter driver 28 until the completion of such a setting operation.

The tunable-filter control system initiates the tracking operation when the input of the modulation signal into the filter driver 28 is started by the external control circuit. The central wavelength $\lambda c$ of the tunable filter 21 is finely modulated at the frequency f, and as a result, a variation in the amount of light at the wavelength $\lambda s$ from a light source (i.e., laser diode (LD)) incident on the light receiving element 23 has a component of frequency f. Since the central wavelength of the DFB filter 21 is proportional to the bias current of the DFB filter 21 in a narrow range, phases of the bias current and the light amount variation in the light receiving element 23 are opposite to each other when $\lambda c>\lambda s$, and are in phase with each other when $\lambda c<\lambda s$.

The delay amount of the modulation signal in the delay circuit 30 is properly set so that phases of the amplified signal from the amplifier 24 and the modulation signal from the sinusoidal wave oscillator 29 are opposite to each other when $\lambda c>\lambda s$, while in phase with each other when $\lambda c<\lambda s$. Therefore, the DC component of the output from the phase comparator 26, into which those two signals are input, is negative when $\lambda c>\lambda s$, and is positive when $\lambda c<\lambda s$. The central wavelength $\lambda c$ of the tunable filter 21 can be drawn into the wavelength $\lambda s$ of the light incident on the light receiving element 23 and stabilized thereat, by performing the feedback control by using the DC component as the error signal.

Thus, in this embodiment, the central wavelength $\lambda c$ of the tunable filter 21 can be drawn into the wavelength $\lambda s$ and stabilized thereat by the feedback control discussed above.

Further, since the tracking feedback control loop is closed within the tunable-filter control system, no external modulation is needed and hence there is no need to separately provide a transmission means for the modulation signal. Furthermore, there is no need to adjust the phase of the modulation signal based on the distance between transmitter and receiver portions. Therefore, even if this embodiment is applied to a local area network (LAN) in which the distance between receiver and transmitter portions is difficult to determine, the structure of the control system can be simplified.

The operation of the tracking monitoring circuit 31 in the tunable filter control system having the above structure will be described in more detail with reference to FIG. 4. FIG. 4 is a graph schematically illustrating draw-in and stable regions. In FIG. 4, as described above, $\lambda c$ is the central wavelength of the transmission spectrum of the tunable filter 21, and $\lambda s$ is the wavelength of the LD or light source which is a reference with respect to the draw-in operation. Further, reference letter L designates a width of the transmission spectrum of the tunable filter 21, and reference letter $\Delta$ designates an amplitude of the wavelength modulation of the tunable filter 21 at the time of draw-in operation. The width L of the transmission spectrum is a range of wavelength within which a light amount larger than a minimum reception sensitivity can enter the light receiving element 23 in the control system. In FIG. 4, the draw-in region and the stable region are respectively indicated on the abscissa as follows:

draw-in region:

$\lambda s-L/2 \sim \lambda s-\Delta/2$ and $\lambda s+\Delta/2 \sim \lambda s+L/2$ stable region:

$\lambda s-\Delta/2 \sim \lambda s+\Delta/2$

The tracking operation in the draw-in and stable regions under the above setting conditions will be described. As discussed above, prior to the initiation of the tracking operation, the central wavelength $\lambda c$ of the tunable filter 21 is set within the draw-in region around the wavelength $\lambda s$ to be received, by the offset signal input into the filter driver 28. At this time, the tracking monitoring circuit 31 is in an OFF-state, and the output amplitude of the sinusoidal wave oscillator 29 is set to an initial value a. The input of control and modulation signals into the filter driver 28 is intercepted until the completion of the above-discussed setting operation. Upon the input of the modulation signal for the tunable filter 21 into the filter driver 28 by the external control circuit, the tracking operation starts.

In the draw-in region, the central wavelength $\lambda c$ of the tunable filter 21 is modulated at the frequency f and with the wavelength displacement or amplitude $\Delta$. As a result, the variation in the intensity of light from the LD at wavelength $\lambda s$ incident on the light receiving element 23 has a component of the frequency f. Since the central wavelength $\lambda c$ of the DFB filter 21 is proportional to its bias current in a narrow range, phases of the bias current and the variation in the light amount received by the light receiving element 23 are opposite to each other when $\lambda c>\lambda s$, while in phase with each other when $\lambda c<\lambda s$, as described above. The delay amount of the modulation signal in the delay circuit 30 is properly set so that phases of the amplified signal from the amplifier 24 and the modulation signal from the sinusoidal wave oscillator 29 are opposite to each other when $\lambda c>\lambda s$, while in phase with each other when $\lambda c<\lambda s$. Therefore, as described above, the DC component level of the output of the phase comparator 26, into which those two signals are input, is negative when $\lambda c>\lambda s$, and is positive when $\lambda c<\lambda s$. The central wavelength $\lambda c$ of the tunable filter 21 is drawn into the wavelength $\lambda s$ incident on the light receiving element 23 by performing the feedback control with the DC component used as the error signal.

Immediately after such a tracking operation is started, the tracking monitoring circuit 31 is turned to an ON-state and starts to monitor the error signal from the LPF 26. While the central wavelength $\lambda c$ is in the draw-in region shown in FIG. 4, the monitoring circuit 31 does not output any signal. Therefore, the output amplitude of the sinusoidal wave oscillator 29 is maintained at the initial value a.

When the central wavelength $\lambda c$ of the tunable filter 21 is drawn-in to the LD wavelength $\lambda s$, i.e., in the stable region, the central wavelength $\lambda c$ periodically fluctuates about the LD wavelength $\lambda s$. Then, the DC component of the output from the phase comparator 25 becomes zero (0), and as a result, the error signal from the LPF 26 is also reduced to zero (0). When the absolute value of the error signal is less than a predetermined value b which is near zero, the tracking monitoring circuit 31 supplies its output to the sinusoidal wave oscillator 29 to reduce the amplitude of the modulation signal to a value smaller than the initial value a (e.g., a/5). When the central wavelength $\lambda c$ deviates from the stable region of the LD wavelength $\lambda s$ and falls within the draw-in region due to external disturbances or the like, the absolute value of the error signal becomes larger than the predetermined value b. Then, the tracking monitoring circuit 31 controls the sinusoidal wave oscillator 29 to return the amplitude of its modulation signal to its initial value a. If again the error signal becomes smaller than the predetermined value b and the central wavelength $\lambda c$ is drawn into the stable region, the above-discussed control operation is again started to suppress the amplitude of the modulation signal.

As described above, in the first embodiment, the magnitude of the modulation of the transmission central wavelength for obtaining the error signal is increased at the draw-in state, while decreased at the stable state. Therefore, the control signal having a large amplitude can be obtained at the draw-in state and the response characteristics during draw-in are improved. On the other hand, the central wavelength fluctuation of the tunable filter 21 is reduced at the stable state.

Second Embodiment

A second embodiment of a tunable filter control system or apparatus according to the present invention will be described. The second embodiment is different from the first embodiment in that the delay circuit for adjusting the phase relationship between two signals input to the phase comparator 25 is omitted.

Figure 5:
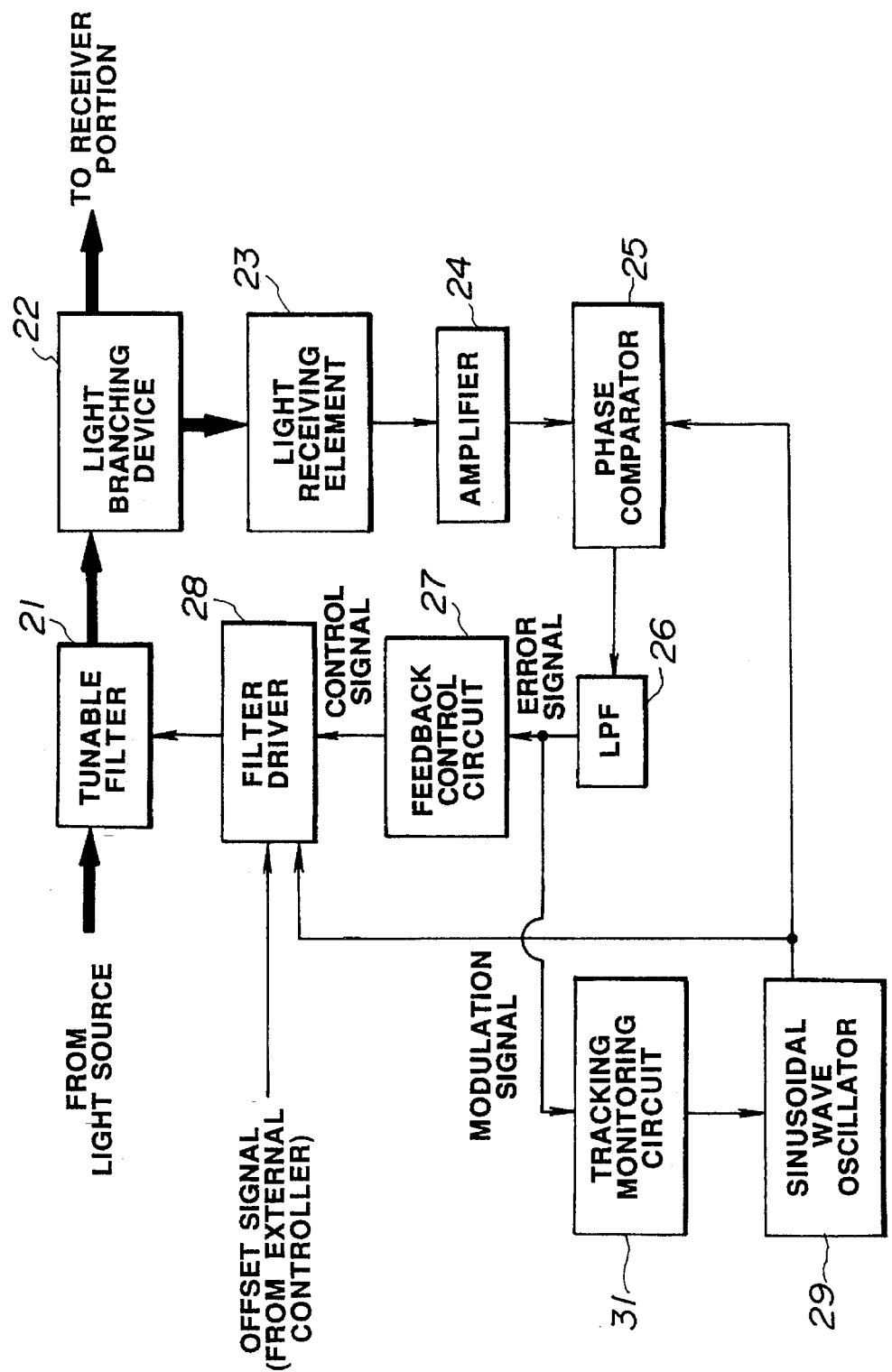
FIG. 5 is a block diagram showing a second preferred embodiment of a tunable-filter control system or apparatus according to the present invention.

FIG. 5 shows the second embodiment. When the modulation frequency f of the sinusoidal wave oscillator 29 can be set to a sufficiently low value so that the phase shift between the two signals can be neglected for the above-mentioned phase relation in the phase comparator 25, the second embodiment can be adopted. The operation thereof is basically the same as that of the first embodiment.

Third Embodiment

A third embodiment of a tunable-filter control system or apparatus according to the present invention will be described. The third embodiment is different from the first embodiment in that a temperature controller is added so that temperature can be used as an operation parameter for the feedback control.

Figure 6:
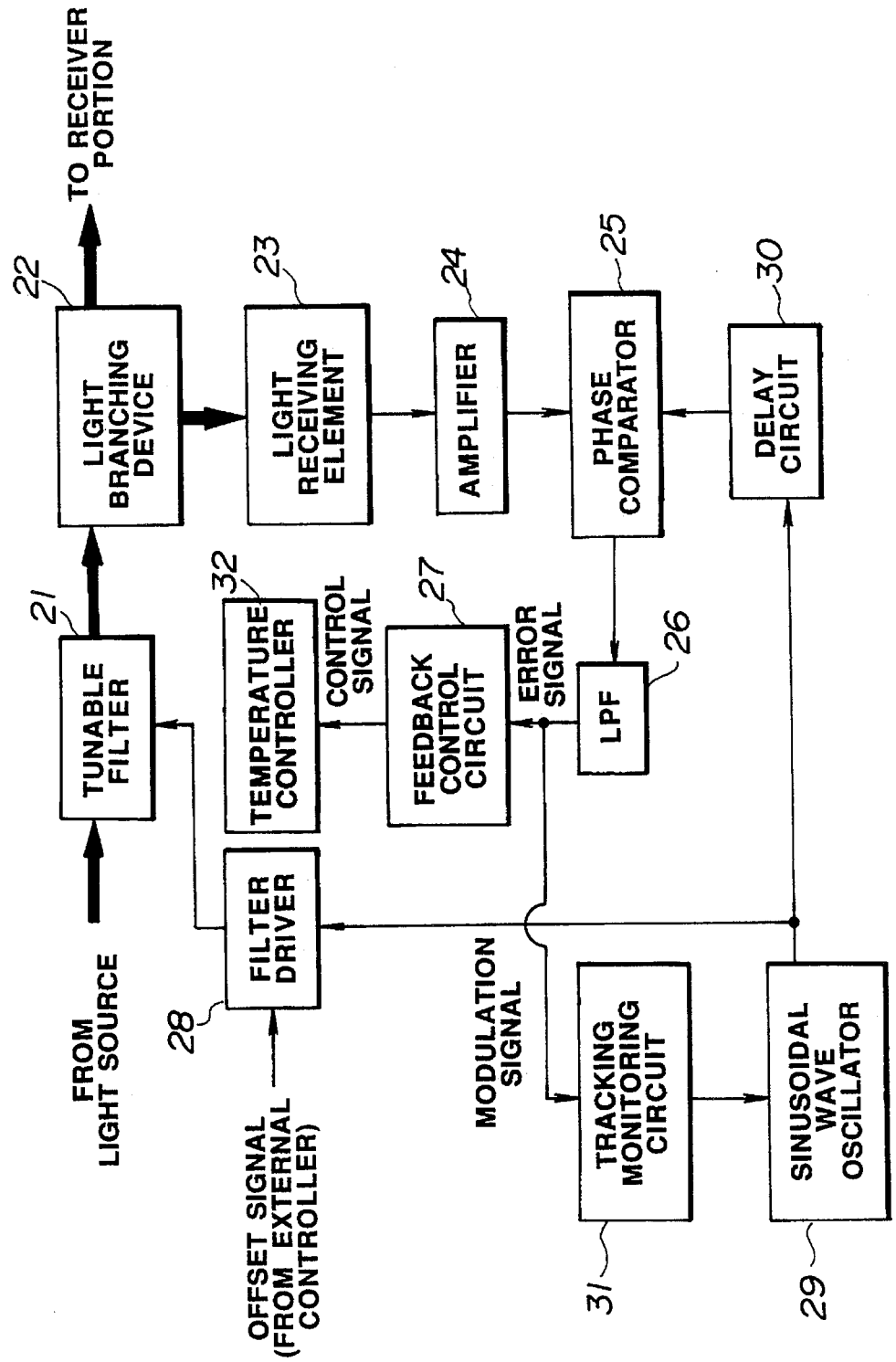
FIG. 6 is a block diagram showing a third preferred embodiment of a tunable-filter control system or apparatus according to the present invention.

FIG. 6 shows the third embodiment. In FIG. 6, reference numeral 32 designates a temperature controller for controlling the temperature of the DFB filter 21, and the temperature controller 32 controls the device temperature of the DFB filter 21 based on the control signal input from the feedback control circuit 27. The output of the filter driver 28 is controlled by two input signals of offset and modulation signals. Since the temperature of the DFB filter 21 is proportional to the central wavelength of the transmission spectrum within a narrow range, the control system of the third embodiment operates in the same manner as the first embodiment.

Fourth Embodiment

A fourth embodiment of a tunable-filter control system or apparatus according to the present invention will be described with reference to FIGS. 7 and 8.

Figure 7:
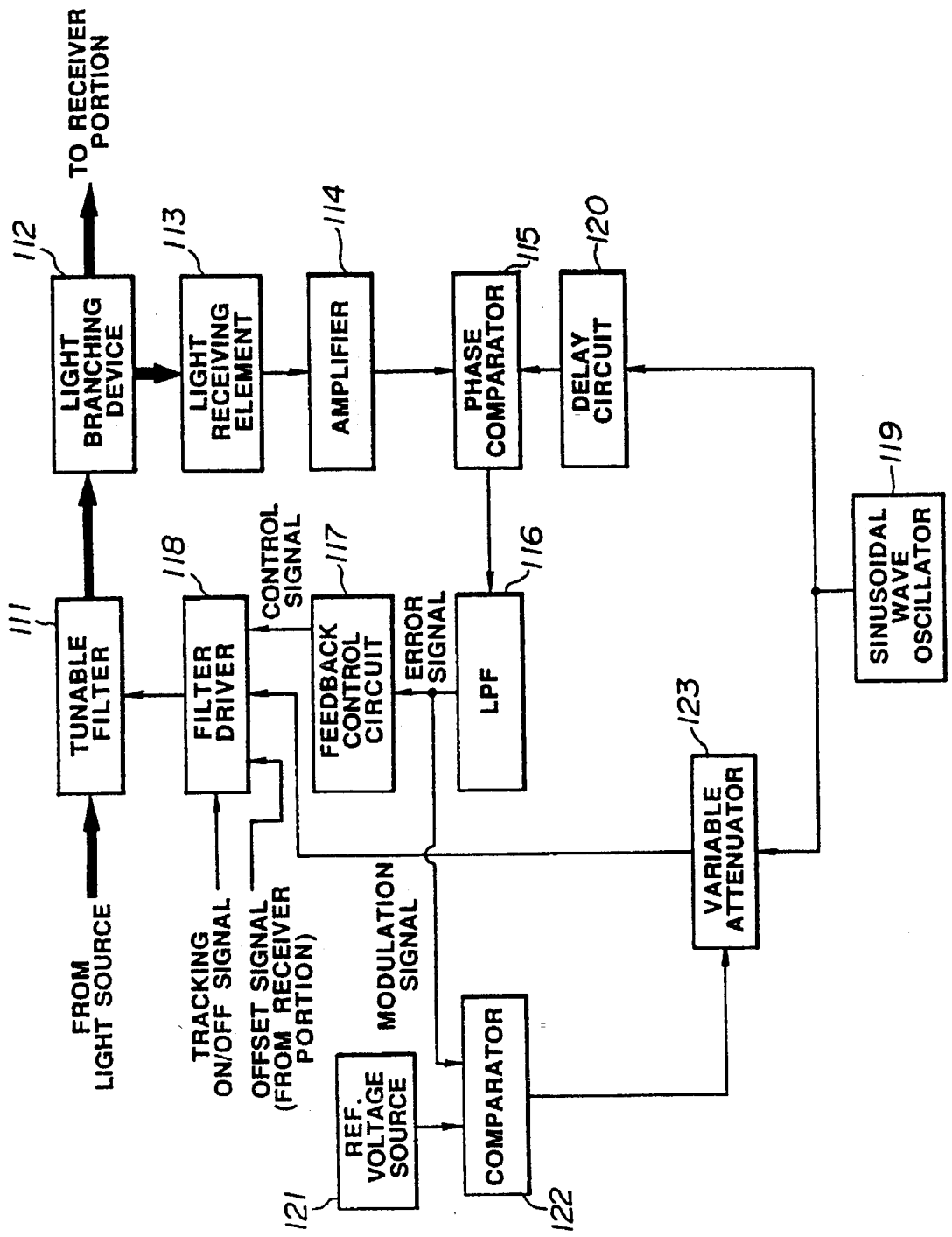
FIG. 7 is a block diagram showing a fourth preferred embodiment of a tunable-filter control system or apparatus according to the present invention.

As shown in FIG. 7, a main portion of a control system of this embodiment is made up of a tunable filter 111, a light branching device 112, a light receiving element or device 113, an amplifier 114, a phase comparator or comparing circuit 115, a low pass filter (LPF) 116, a feedback control circuit 117, a filter driver or control circuit 118, a sinusoidal wave oscillator 119 for generating a modulation signal, a delay circuit 120, reference voltage source 121, a comparator 122 and a variable attenuator 123. The tunable filter 111, light branching device 112, light receiving element 113, amplifier 114, phase comparator 115, LPF 116, feedback control circuit 117, filter driver 118 and other devices respectively have the following structures and operations.

The tunable filter 111 is comprised of a DFB filter, similar to the above embodiments. The DFB filter 111 can control the central wavelength of the transmission spectrum by changing its injection current in a range near its oscillation threshold. Since the central wavelength and the injection current are proportional to each other in a narrow range, the central wavelength can be modulated in tune with a modulation signal by superposing the modulation signal of a small amplitude on a bias component of the injection current. The light branching device 112 branches a portion of light transmitted through the tunable filter 111 for use in the tracking operation. The light receiving element 113 converts the portion of the light signal separated for the tracking operation by the light branching device 112 into an electric signal, and the amplifier 114 amplifies the electric signal.

The phase comparing circuit 115 serves as a circuit for comparing the phase of the amplified signal from the amplifier 114 with the phase of the modulation signal, and is mainly comprised of a synchronous detection device or a multiplier.

The LPF 116 is a filter for extracting a low-frequency component from the output signal of the phase comparator 115, and its cut-off frequency is properly set so that the minute modulation at a frequency f output from the sinusoidal wave oscillator 119 can be sufficiently attenuated.

The feedback control circuit 117 generates a control signal by using the signal from the LPF 116 as an error signal. A well-known proportional-integral-differential (PID) control is preferably adopted as a feedback control method. The filter driver 118 is supplied with the control signal, the modulation signal from the sinusoidal wave oscillator 119 and an offset signal from a receiver portion, and its output, i.e., the injection current into the DFB filter 111, is controlled. The ON-OFF control of the tracking operation is performed by the filter driver 118 under the control of the receiver portion. At the ON-time of tracking, the output current of the filter driver 118 is determined by three signals of the control signal, the modulation signal and the offset signal. At the OFF-time of tracking, the output current is determined only by the offset signal. In this specification, the receiver portion from which the above-noted offset signal is accepted is an apparatus in which the control system of the present invention is built.

The sinusoidal wave oscillator 119 generates the modulation signal for modulating the central wavelength of the DFB filter 111. The modulation signal is divided into two portions, and one is input to the filter driver 118 through the variable attenuator 123 while the other is input into the phase comparator 115 through the delay circuit 120. An upper limit of the modulation frequency f is determined from the band of a transmitted signal, and a lower limit is determined from a response speed of tracking. The frequency f usually lies within a range from several hundred Hz to several kHz. The delay circuit 120 compensates for the phase deviation between the two input signals in the phase comparator 115.

The reference voltage source 121 generates a reference voltage Vet for acting as a reference of exchange of the modulation amplitude. The comparator 122 compares the reference voltage Vet and the error signal with each other, and its output is OFF-controlled when the error signal surpasses the reference voltage Vet, while ON-controlled when the error signal is smaller than the reference voltage Vet. The attenuation factor of the variable attenuator 123 is controlled in accordance with the output of the comparator 122. The attenuation factor is small when the output of the comparator 122 is OFF-controlled, while large when the output of the comparator 122 is ON-controlled.

When a multi-electrode DFB filter is used as the tunable filter 111, the number of output currents from the filter driver 118 is the same as the number of the electrodes, and the central wavelength of the tunable filter 111 can be changed by controlling injection currents applied to each of the respective electrodes. The modulation in the central wavelength of the tunable filter 111 for tracking is performed by superposing a sinusoidal wave current of a minute amplitude on the injection current applied to one electrode of the tunable filter 111.

Figure 8:
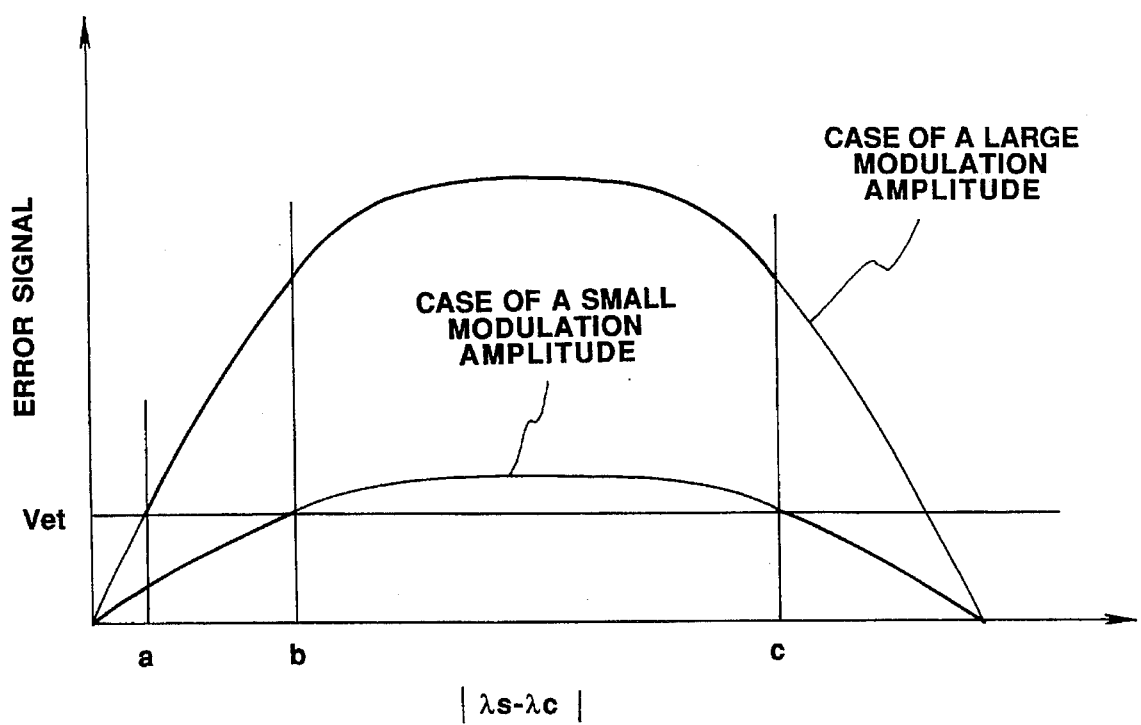
FIG. 8 is a graph illustrating a relation between an error signal and a wavelength difference $|\lambda s-\lambda c|$ in the fourth embodiment.

FIG. 8 illustrates a relation between the error signal and the wavelength difference $|\lambdaس-\lambda c|$ between the wavelength $\lambda s$ of the received light signal and the central wavelength $\lambda c$ of the transmission spectrum of the DFB filter 111. As illustrated in FIG. 4, the transmission spectrum of the tunable filter 111 normally has a shape whose slope is gentle at its peak and feet. The wavelength modulation component of the central wavelength in the transmission spectrum is converted to a light intensity modulation component by the slope of the transmission spectrum. Since the error signal is created based on the light intensity modulation component, the magnitude of the error signal is small when the wavelength $\lambda s$ of the light signal is located at the peak or foot of the transmission spectrum of the tunable filter 111. Further, the magnitude of the error signal also varies depending on the magnitude of the modulation amplitude of the central wavelength. In FIG. 8, two cases, i.e., a case of a large modulation amplitude and a case of a small modulation amplitude, are indicated.

In this embodiment, the tracking state is monitored through the magnitude of the error signal, and accordingly the modulation amplitude of the central wavelength is changed. The modulation amplitude is increased when the error signal surpasses the reference voltage Vet, and is decreased when the error signal is below the reference voltage Vet. As a result, the error signal varies for the wavelength difference |λs–λc| as indicated by a thick line in FIG. 8. Letters a, b and c in FIG. 8 show positions where the amplitude of the modulation signal for the central wavelength is changed over between the case of a large modulation amplitude and the case of a small modulation amplitude. When the wavelength difference falls between the positions a and b during the draw-in operation, a change in the error signal occurs along a curve of the case of a large modulation amplitude. On the other hand, a change in the error signal occurs along a curve of the case of a small modulation amplitude when the wavelength difference |λs–λc| falls between the positions a and b, due to external disturbances, at the stable time.

The operation of the control system of this embodiment will be described with reference to FIGS. 4, 7 and 8. The operation for creating the error signal by modulating the DFB filter central wavelength λc and tracking the central wavelength λc to the wavelength λs of the light signal is the same as that of the prior art. Further, the central wavelength λc of the DFB filter is set to be in the draw-in region for the wavelength λs of the light signal prior to initiation of the tracking operation.

Immediately before the tracking is initiated, the tunable filter 111 is not modulated, and the error signal output from the LPF 116 is zero. Therefore, the ouput of the comparator 122 is ON-controlled, and the attenuation factor of the variable attenuator 123 is large. Thus, the modulation signal amplitude of the sinusoidal wave oscillator 119 input into the filter driver 118 is small, and the error signal traces the curve of the case of a small modulation amplitude shown in FIG. 8.

When the wavelength difference |λs–λc| is in a range between the positions b and c in the initial setting step, the error signal surpasses the reference voltage Vet after the initiation of the tracking operation, and therefore, the output of the comparator 122 is OFF-controlled. Thus, the attenuation factor of the variable attenuator 123 is small, and hence the amplitude of the modulation signal input into the filter driver 118 is large. The error signal is produced by the modulation signal having a large amplitude, and the central wavelength λc of the DFB filter approaches the wavelength λs of the light signal, similar to the prior art. At this time, the error signal, i.e., the output of the LPF 116, shifts along the curve of the case of a large modulation amplitude shown in FIG. 8.

When the error signal is below the reference voltage Vet, the output of the comparator 122 is ON-controlled, and hence the attenuation factor of the variable attenuator 123 is increased. As a result, the amplitude of the modulation signal input into the filter driver 118 from the sinusoidal wave oscillator 119 lessens. Thus, the error signal shifts to the curve of the case of a small modulation amplitude shown in FIG. 8 and moves towards zero. The central wavelength λc of the DFB filter approaches the wavelength λs of the light signal under a precision condition of the control system.

When the wavelength difference |λs–λc| is less than the value at the position b in the initial setting step, the error signal is still below the reference voltage Vet after the initiation of a tracking operation. The error signal remains on the curve in the case of a small modulation amplitude shown in FIG. 8 and moves towards zero. The central wavelength λc of the DFB filter approaches the wavelength λs of the light signal under a precision condition of the control system.

When the wavelength difference |λs–λc| is larger than the value at the position c in the initial setting step, the error signal is still below the reference voltage Vet after the initiation of tracking operation. The error signal still remains on the curve in the case of a small modulation amplitude shown in FIG. 8. As the DFB filter central wavelength λc approaches the wavelength λs of the light signal, the error signal increases due to the steeper slope of the transmission spectrum away from its feet. Upon the error signal surpassing the reference voltage Vet, the attenuation factor of the variable attenuator 123 lessens. As a result, the amplitude of the modulation signal from the sinusoidal wave oscillator 119 is increased. Afterwards, the draw-in operation is conducted in the same manner as that in the above case where the wavelength difference |λs–λc| is in a range between the positions b and c in the initial setting step.

Figure 4:
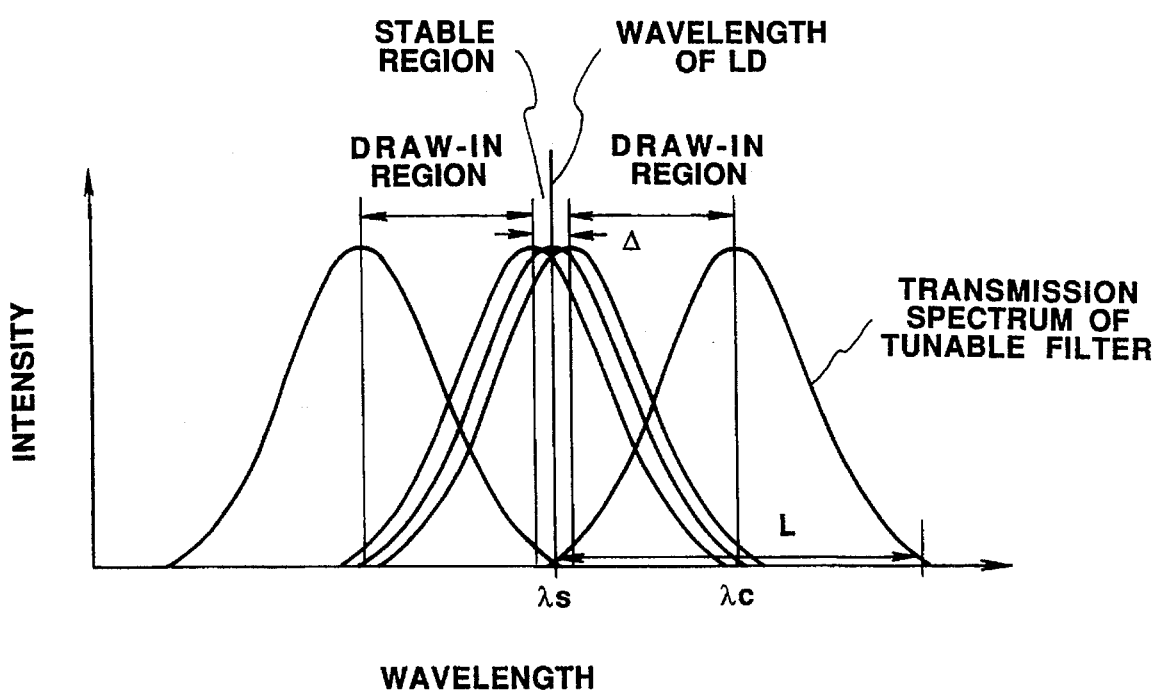
FIG. 4 is a graph illustrating a draw-in range and a stable range.

When the DFB filter central wavelength λc deviates from the wavelength λs of the light signal due to some external disturbances (it is assumed this deviation is within the draw-in region shown in FIG. 4), the error signal varies along the curve in the case of a small modulation amplitude shown in FIG. 8. While the error signal is below the reference voltage Vet, the draw-in is conducted with the modulation amplitude being maintained at a small value. Thus, the DFB filter central wavelength λc approaches the wavelength λs of the light signal. When the error signal surpasses the reference voltage Vet, the output of the comparator 122 is OFF-controlled, and the attenuation factor of the variable attenuator 123 is reduced. As a result, the amplitude of the modulation signal input into the filter driver 118 from the sinusoidal wave oscillator 119 is changed to a large value. Thereby, the error signal shifts to and moves along the curve in the case of a large modulation amplitude shown in FIG. 8, for a small deviation of the wavelength. Also in this case, the DFB filter central wavelength λc is drawn into the wavelength λs of the light signal based on the error signal.

In this embodiment, as described above, the tracking condition is monitored by comparing the error signal to the reference value, and changing the amplitude of the modulation signal in accordance with the comparison result. Thus, the error signal varies for the wavelength difference |λs–λc| along the thick line shown in FIG. 8. Consequently, the modulation amplitude is made small in the stable state after the completion of the draw-in operation by the tracking, so that the wavelength fluctuation can be suppressed in the stable state. Further, the modulation amplitude is properly increased at the tracking initiation time and at the deviation time due to external disturbances, so that a large error signal can be obtained. Thus, an amount of time required for completing the draw-in operation can be highly reduced.

Fifth Embodiment

Figure 9:
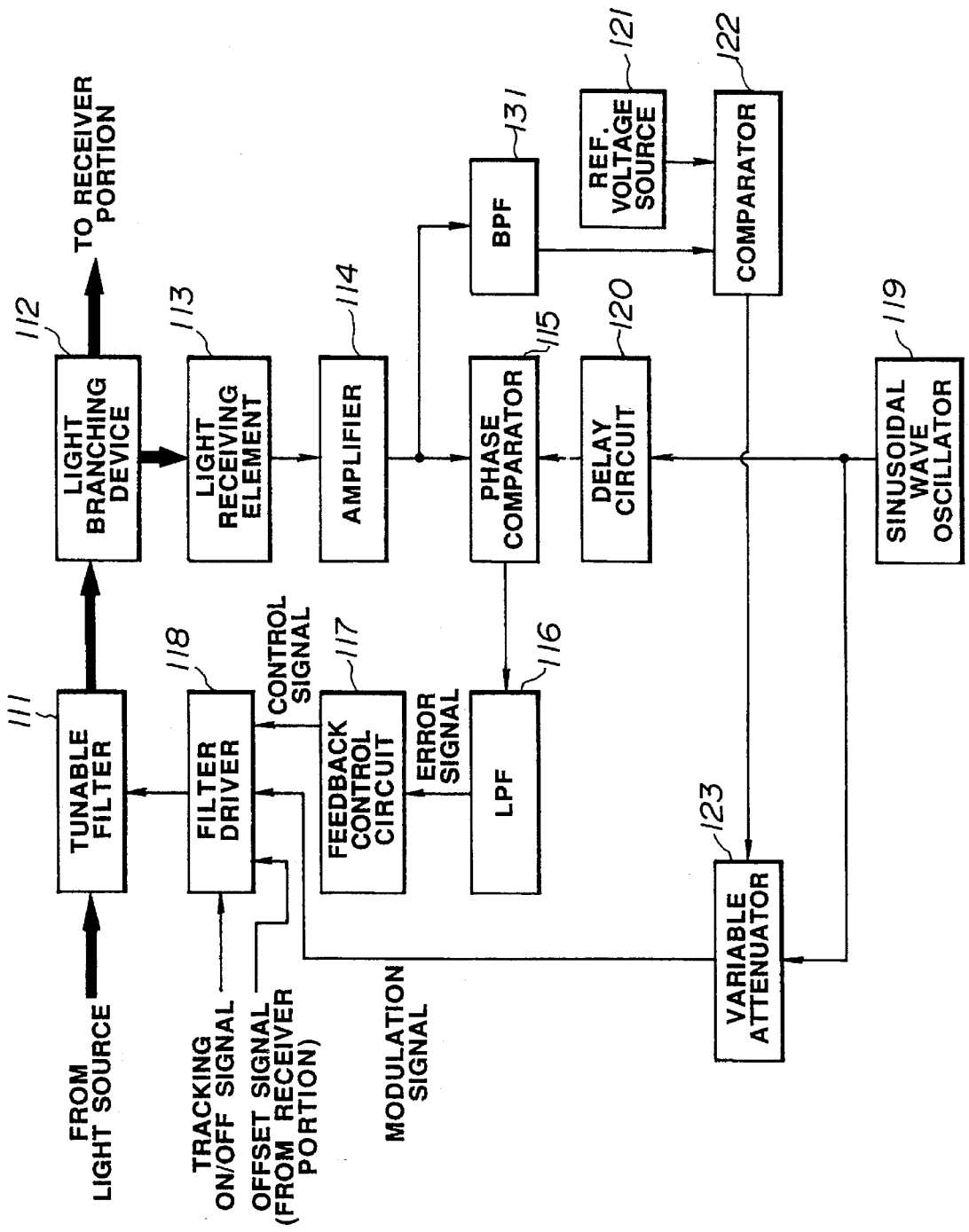
FIG. 9 is a block diagram showing a fifth preferred embodiment of a tunable-filter control system or apparatus according to the present invention.

A fifth embodiment of a tunable filter control system or apparatus according to the present invention will be described with reference to FIG. 9. The fifth embodiment is different from the fourth embodiment only in that a band pass filter (BPF) 131 is arranged for extracting a modulation component of the output of the amplifier 114, and in that the extracted modulation component is input to the comparator 122.

In this embodiment, the tracking condition or state is monitored by using the amplitude of the modulation component of a received signal. Since the error signal is produced based on the modulation component of the received signal, this modulation component varies for the wavelength difference $|\lambda s-\lambda c|$ as illustrated in FIG. 8, similar to the change of the error signal. The amplitude of a modulation signal from the sinusoidal wave oscillator 119 is changed by comparing the amplitude of the above-mentioned modulation component to a reference voltage and changing the modulation signal amplitude in accordance with the comparison result. Thus, the fifth embodiment operates in substantially the same manner as the fourth embodiment.

Sixth Embodiment

A sixth embodiment of a tunable-filter control system or apparatus according to the present invention will be described with reference to FIGS. 10 and 11. The sixth embodiment is different from the fourth embodiment only in that another LPF 141 is arranged for attenuating a modulation component of the output of the amplifier 114, and in that the thus attenuated output from the amplifier 114 is input into the comparator 122.

Figure 11:
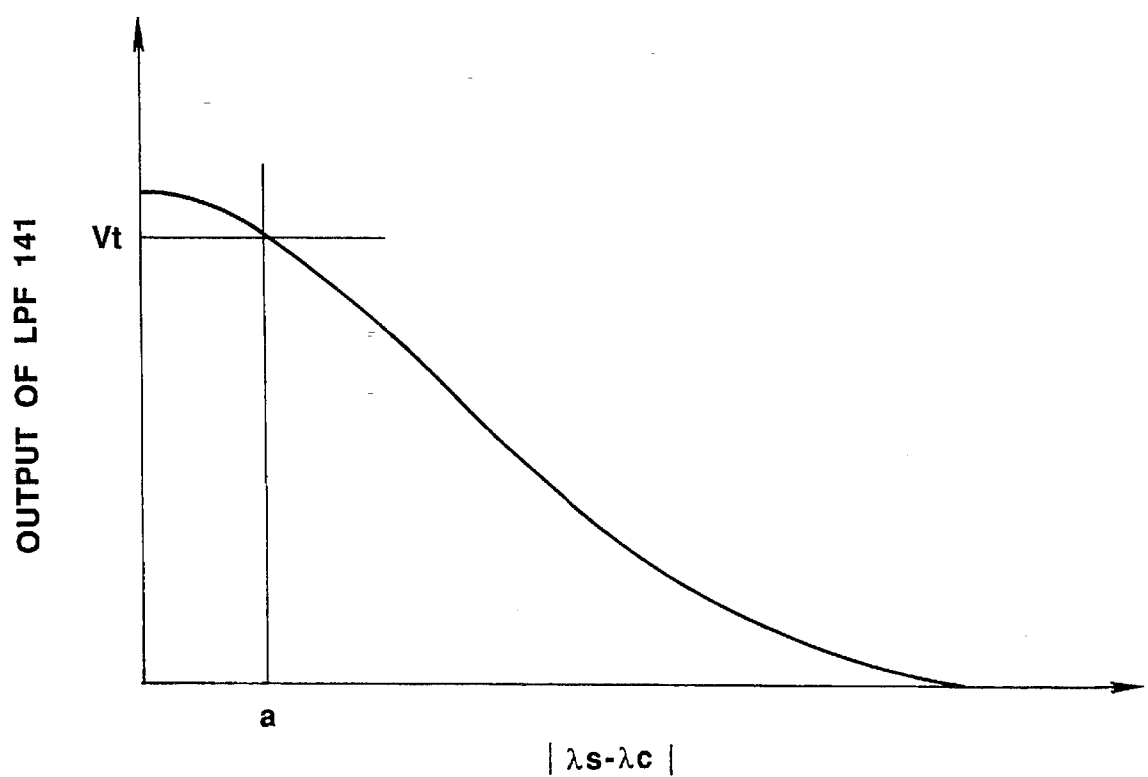
FIG. 11 is a graph illustrating a relation between an output of low pass filter (LPF) 141 and a wavelength difference $|\lambda s-\lambda c|$ in the sixth embodiment.

FIG. 11 illustrates a relation between the wavelength difference $|\lambda s-\lambda c|$ and the output of the LPF 141. The output of the LPF 141 corresponds to the magnitude of the received signal, and varies in the same form as the transmission spectrum of the tunable filter 111. The output of the LPF 141 is maximum when the wavelength difference $|\lambda s-\lambda c|$ is zero (0), and decreases as the wavelength difference $|\lambda s-\lambda c|$ increases. In FIG. 11, a reference voltage for distinguishing between a draw-in time and a stable time is designated by Vt, and a value of the wavelength difference $|\lambda s-\lambda c|$ at this time is indicated by a.

Figure 10:
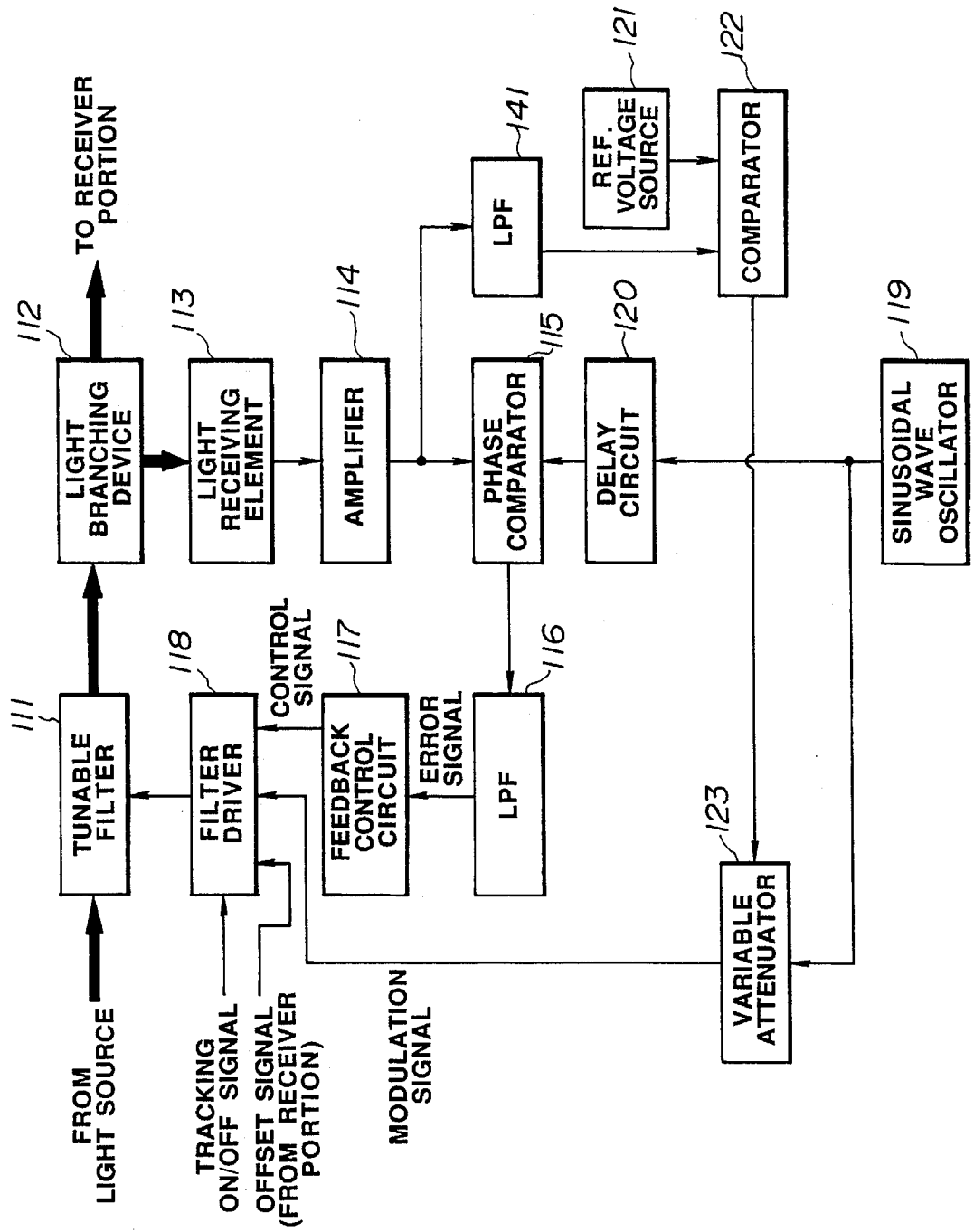
FIG. 10 is a block diagram showing a sixth preferred embodiment of a tunable-filter control system or apparatus according to the present invention.

In this embodiment, the tracking condition is monitored by using the magnitude of a low frequency component of the received signal (in FIG. 10, the output of the LPF 141). The modulation amplitude of the tunable filter 111 is changed based on the comparison result between the reference voltage Vt and the output of the LPF 141. The output of the comparator 122 is OFF-controlled when the output of the LPF 141 is smaller than the reference voltage Vt, and the attenuation factor of the variable attenuator 123 is reduced. On the other hand, when the output of the LPF 141 surpasses the reference voltage Vt, the output of the comparator 122 is ON-controlled and the attenuation factor of the variable attenuator 123 is increased. Thereby, the amplitude of the modulation signal is set to a large value when the wavelength difference is on a right-hand side of the position a on the $|\lambda s-\lambda c|$ axis in FIG. 11, and is set to a small value when the wavelength difference is on a left-hand side of the position a. In this embodiment, the modulation amplitude may be set to zero (0) on the left-hand side of the position a. Thus, fluctuations due to the modulation signal can be eliminated at the stable time.

The operation of other components of this embodiment is substantially the same as that of the fourth embodiment.

Seventh Embodiment

Figure 12:
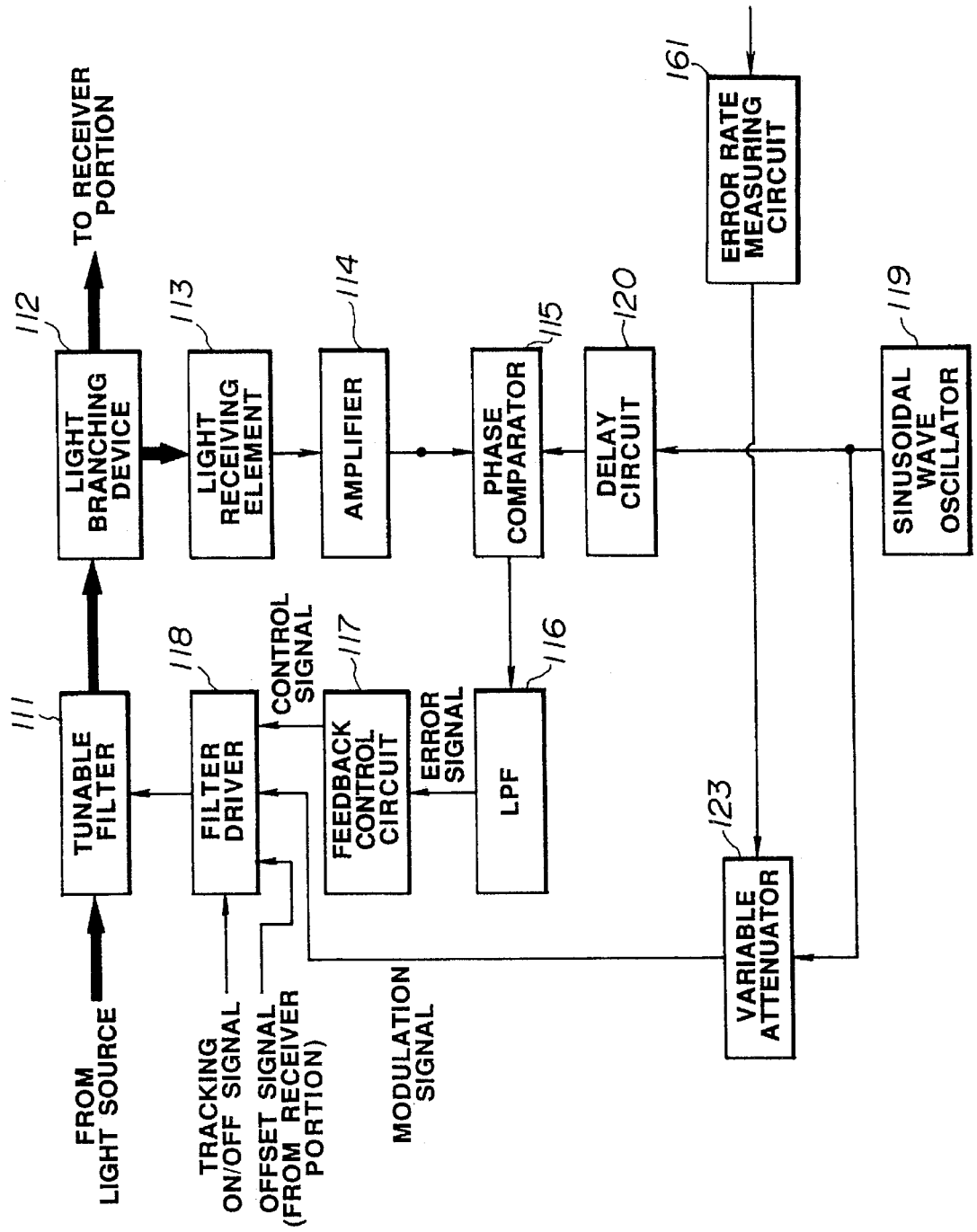
FIG. 12 is a block diagram showing a seventh preferred embodiment of a tunable-filter control system or apparatus according to the present invention.

A seventh embodiment of a tunable-filter control system or apparatus according to the present invention will be described with reference to FIG. 12. The seventh embodiment is different from the fourth embodiment only in that an error rate measuring circuit 161 is arranged, in place of a reference voltage source and comparator, for controlling the variable attenuator 123 by the output of the measuring circuit.

In this embodiment, an error correcting code or error detecting code is used as a transmitted signal. The error rate measuring circuit 161 calculates an error rate of a received signal input from a receiver portion, and its output is ON/OFF-controlled. When the error rate does not satisfy a tolerance value of a communication system to which this control system is applied, the output of the error rate measuring circuit 161 is OFF-controlled, and the attenuation factor of the variable attenuator 123 is reduced. When the tolerance value is satisfied, the output of the error rate measuring circuit 161 is ON-controlled and the attenuation factor of the variable attenuator 123 is increased.

The operation of other components of this embodiment is substantially the same as that of the fourth embodiment.

Eighth Embodiment

Figure 13:
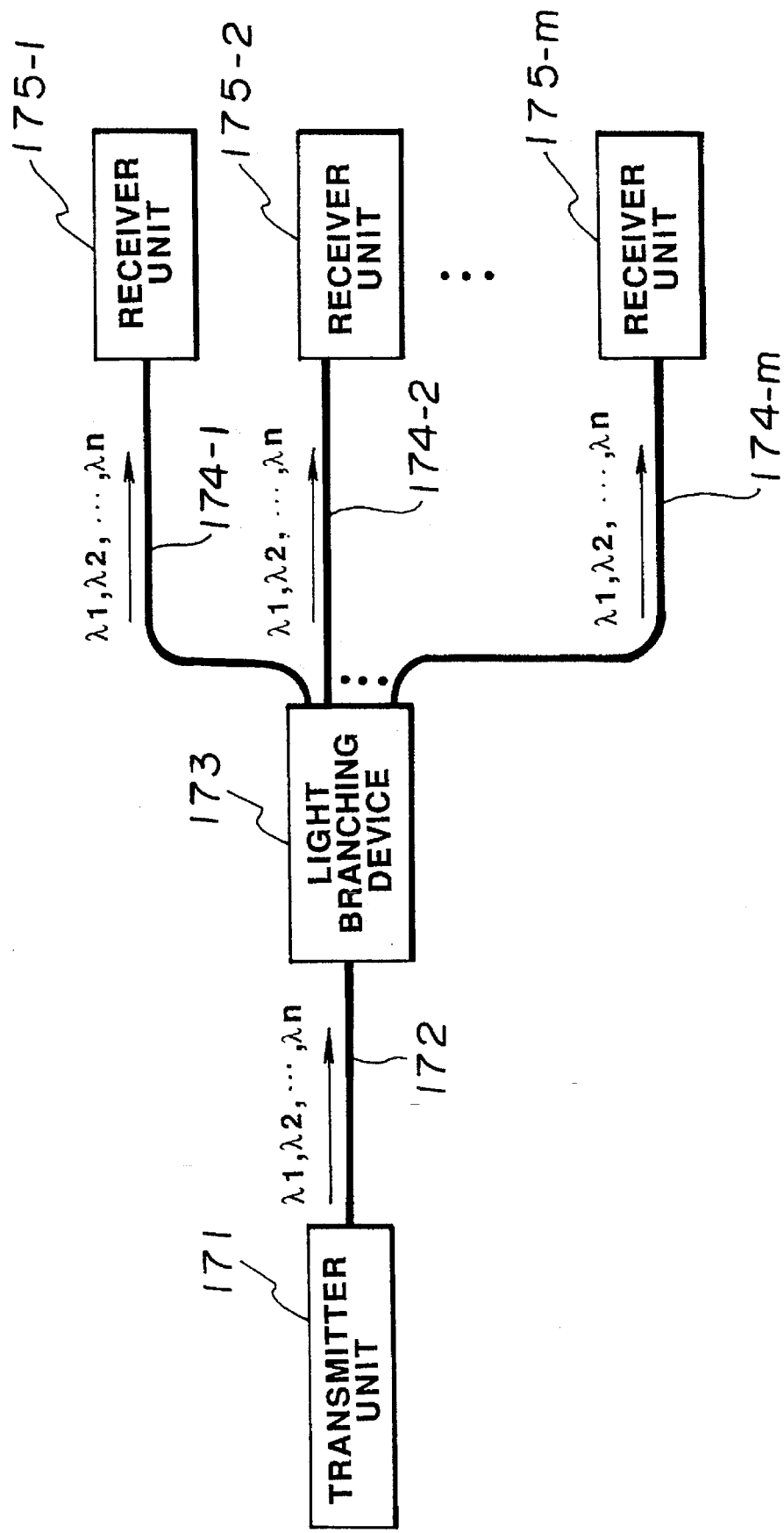
FIG. 13 is a block diagram showing an eighth preferred embodiment of the invention, which is an optical communication system according to the present invention.

An eighth embodiment of the invention, which is a wavelength division multiplexing optical communication system including a tunable-filter control system according to the present invention, will be described with reference to FIG. 13. This system preferably can be used for delivery of an image. In FIG. 13, reference letter n designates the number of channels, reference letter m designates the number of receiver apparatuses and reference letters $\lambda 1, \lambda 2, \ldots, \lambda n$ designate wavelengths of respective channels. In a transmitter apparatus or unit 171, n light sources are respectively modulated based on digital image signals, and signals are transmitted to an optical fiber 172. The light signals are branched into m optical fibers 174-1~174-m by a light branching device 173, and are transmitted to receiver apparatuses or units 175-1~175-m. Respective receiver units 175-1~175-m include tunable filters to which the control system of the first embodiment, fourth embodiment or the like is applied, thereby selecting light at a wavelength to be received from the wavelength multiplexed signals to receive the desired image signal.

In this embodiment, since the tunable filter control system of the present invention is utilized, the central wavelength of the tunable filter can be tracked to the wavelength of light to be received, and fluctuations due to the modulation signal can be suppressed at the tracking time. Thus, a favorable reception condition can be maintained.

Other Embodiments

In the above embodiments, the modulation amplitude of the tunable filter is changed over between two values, based on a single reference value. However, this modulation amplitude may be changed over between a plurality (more than two) of values by using a plurality of reference values. Further, in the above embodiments, an error signal, amplitude of a modulation component, magnitude of a received signal, or error rate is used for monitoring the tracking condition, but other values may be used. While the DFB filter is used as a tunable filter, other tunable filters may be used only if the central wavelength of a transmission spectrum thereof can be controlled. Furthermore, a sinusoidal wave is used as a modulation signal for obtaining the error signal, but other signals having phase data may be employed.

Further, while the transmission light passing through the tunable filter is branched by the light branching device for separating a portion of a signal for performing tracking in the above embodiments, the entire light signal may be converted to an electric signal at the stage of a light signal and thereafter a component of a frequency f may be separated by an electric filter to be used as a signal for tracking. In this case, the light receiving element is placed at the position of the light branching device in the above embodiments.

As described in the foregoing, according to the present invention, the feedback control of tracking is closed within a receiver unit, so that no external modulation signal is needed. Thus, a separate transmission line need not be provided for the transmission of the modulation signal.

Further, there is no need to adjust the phase of the transmission signal depending on the distance between receiver and transmitter units. Therefore, the present invention can be applied to a LAN in which the distance between transmitter and receiver units is difficult to determine, and the structure of the tunable filter control system therein can be simplified.

Moreover, an error signal is large at the draw-in time, and fluctuations of the central wavelength of the transmission spectrum due to the modulation signal can be reduced at the stable time. As a result, tracking characteristics can be improved, and excellent signal reception can be achieved.

Except as otherwise disclosed herein, the various components shown in outline or block form in the Figures are individually well known in the tunable filter controlling and optical communicating arts, and their internal construction and operation are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A tunable-filter control method for tuning a central wavelength of a transmission spectrum of a tunable-filter to a wavelength of a light signal input to the tunable filter, said method comprising the steps of:

modulating the central wavelength of the transmission spectrum of the tunable-filter with a modulation signal having a modulation amplitude;

generating an error signal based on an output of the tunable-filter modulated by said modulating step for use in determining a tuning state and the modulation amplitude;

monitoring the tuning state which comprises a draw-in state and a stable state;

increasing the modulation amplitude of the modulation signal in said modulating step during the draw-in state; and decreasing the modulation amplitude of the modulation signal in said modulating step during the stable state.

2. A tunable-filter control method according to claim 1, further comprising a step of comparing a phase of an intensity modulation component of a light output from the tunable-filter to a phase of the modulation signal used in said modulating step, the intensity modulation component being generated by modulating the central wavelength of the tunable-filter, wherein the generated error signal is based on a result of said comparing step.

3. A tunable-filter control method according to claim 1, wherein said monitoring step comprises comparing with a comparator the error signal to a reference voltage generated by a reference voltage source.

4. A tunable-filter control method according to claim 1, wherein said monitoring step comprises comparing with a comparator a band pass filtered amplitude of an intensity modulation component of a light output from the tunable-filter to a reference voltage generated by a reference voltage source.

5. A tunable-filter control method according to claim 1, wherein said monitoring step comprises comparing with a comparator a low pass filtered amplitude of an intensity modulation component of a light output from the tunable-filter to a reference voltage generated by a reference voltage source.

6. A tunable-filter control method according to claim 1, wherein said monitoring step comprises monitoring an error rate of the light signal with an error rate measuring circuit.

7. A tunable-filter control method according to claim 1, wherein the tunable-filter comprises a distributed feedback filter.

8. A tunable-filter control method according to claim 1, wherein said modulating step comprises modulating the central wavelength of the tunable-filter with a sinusoidal wave.

9. A tunable-filter control method according to claim 2, wherein said comparing step comprises adjusting a relation between the phase of the intensity modulation component and the phase of the modulation signal with a delay circuit.

10. A tunable-filter control method according to claim 2, wherein said comparing step comprises comparing the phase of the intensity modulation component to the phase of the modulation signal with a synchronous detection device and a multiplier.

11. A tunable-filter control method according to claim 1, further comprising a step of tuning the central wavelength to the light signal wavelength based on the error signal, wherein the central wavelength of the tunable filter is drawn into and stabilized at the wavelength of the light signal using a proportional-integral-differential control type feedback control method.

12. A tunable-filter control method according to claim 1, further comprising a step of tuning the central wavelength of the tunable-filter to the wavelength of the light signal by controlling a bias current injected into the tunable-filter.

13. A tunable-filter control method according to claim 1, further comprising a step of tuning the central wavelength of the tunable-filter to the wavelength of the light signal by controlling a device temperature of the tunable-filter.

14. A tunable-filter control method according to claim 1, wherein said monitoring step comprises monitoring the error signal.

15. A tunable-filter control method according to claim 1, wherein said modulating step comprises modulating the central wavelength of the tunable-filter with a modulation signal having phase information.

16. A tunable-filter control method according to claim 1, wherein said modulating step comprises modulating the central wavelength of the tunable-filter with a modulation signal from a modulation signal oscillator, and controlling the modulation signal by changing an attenuation factor of a variable attenuator so as to increase the modulation amplitude of the modulation signal during the draw-in state and to decrease the modulation amplitude of the modulation signal during the stable state.

17. A tunable-filter control apparatus for tuning a central wavelength of a transmission spectrum of a tunable-filter to a wavelength of a light signal input to the tunable-filter, said apparatus comprising:

a tunable-filter having a variable central wavelength of a transmission spectrum;

modulation signal supplying means for supplying a modulation signal having a modulation amplitude for modulating the variable central wavelength of the transmission spectrum of said tunable filter, error signal generating means for generating an error signal based on an output of said tunable-filter for use in determining a tuning state and the modulation amplitude;

filter control means, wherein said filter control means uses the error signal from said error signal generating means to tune the central wavelength to the light signal wavelength by feedback control; and monitoring means for monitoring a tuning state of said filter control means, said tuning state comprising a draw-in state and a stable state, and for controlling said modulation signal supplying means so as to increase the modulation amplitude of the modulation signal during the draw-in state and to decrease the modulation amplitude of the modulation signal during the stable state.

18. A tunable-filter control apparatus according to claim 17, further comprising means for extracting an intensity modulation component of a light output from said tunable-filter, the intensity modulation component being generated by modulating the central wavelength of the tunable-filter, and wherein said error signal generating means comprises means for generating the error signal by comparing a phase of the intensity modulation component of the light output from said tunable-filter to a phase of the modulation signal from said modulation signal supplying means.

19. A tunable-filter control apparatus according to claim 17, wherein said monitoring means comprises a reference voltage source that produces a reference voltage and a comparator for monitoring the tuning state by comparing the error signal to the reference voltage produced by said reference voltage source.

20. A tunable-filter control apparatus according to claim 18, wherein said monitoring means comprises a band pass filter, a reference voltage source that produces a reference voltage and a comparator for monitoring the tuning state by comparing an amplitude of said intensity modulation component output from said band pass filter to the reference voltage produced by said reference voltage source.

21. A tunable-filter control apparatus according to claim 18, wherein said monitoring means comprises a low pass filter, a reference voltage source that produces a reference voltage and a comparator for monitoring the tuning state by comparing an amplitude of said intensity modulation component output from said low pass filter to the reference voltage produced by said reference voltage source.

22. A tunable-filter control apparatus according to claim 17, wherein said monitoring means comprises an error rate measuring means for monitoring the tuning state by monitoring a measured error rate obtained by measuring an error rate of a received signal transmitted through said tunable-filter.

23. A tunable-filter control apparatus according to claim 17, wherein said tunable-filter comprises a distributed feedback filter.

24. A tunable-filter control apparatus according to claim 17, wherein said modulation signal supplying means supplies a sinusoidal wave.

25. A tunable-filter control apparatus according to claim 18, further comprising a delay circuit for adjusting a relation between the phase of the intensity modulation component and the phase of the modulation signal.

26. A tunable-filter control apparatus according to claim 18, wherein said error signal generating means comprises a synchronous detection device and a multiplier to compare the phase of the intensity modulation component with the phase of the modulation signal.

27. A tunable-filter control apparatus according to claim 17, wherein said filter control means comprises proportional-integral-differential control means for drawing the central wavelength of said tunable-filter into the wavelength of the light signal based on the error signal, and for stabilizing the central wavelength at the light signal wavelength.

28. A tunable-filter control apparatus according to claim 17, wherein said filter control means comprises means for tuning the central wavelength of said tunable-filter to the light signal wavelength by controlling a bias current injected into said tunable-filter.

29. A tunable-filter control apparatus according to claim 17, wherein said filter control means comprises means for tuning the central wavelength of said tunable-filter to the light signal wavelength by controlling a device temperature of said tunable-filter.

30. A tunable-filter control apparatus according to claim 17, wherein said monitoring means comprises means for monitoring the tuning state using the error signal.

31. A tunable-filter control apparatus according to claim 17, wherein said modulation signal supplying means comprises means for supplying a modulation signal having phase information.

32. A tunable-filter control apparatus according to claim 17, wherein said monitoring means comprises a variable attenuator to control the modulation signal from said modulation signal supplying means by changing an attenuation factor of said variable attenuator.

33. An optical communication system comprising:

a light transmission line;

a transmitter unit connected to said light transmission line for transmitting a light signal through said light transmission line; and a receiver unit also connected to said light transmission line for receiving the light signal transmitted through said transmission line, said receiver unit comprising a tunable-filter having a transmission spectrum with a variable central wavelength and a tunable-filter control apparatus for tuning the central wavelength of the transmission spectrum of the tunable filter to a wavelength of the light signal, said tunable-filter control apparatus comprising:

modulation signal supplying means for supplying a modulation signal having a modulation amplitude for modulating the variable central wavelength of the transmission spectrum of the tunable-filter;

error signal generating means for generating an error signal based on an output from the tunable-filter for use in determining a tuning state and the modulation amplitude;

filter control means, wherein said filter control means uses the error signal from said error signal generating means to tune the central wavelength to the light signal wavelength by feedback control; and monitoring means for monitoring a tuning state of said filter control means, said tuning state comprising a draw-in state and a stable state, and for controlling the modulation signal supplying means so as to increase the modulation amplitude of the modulation signal during the draw-in state and to decrease the modulation amplitude of the modulation signal during the stable state.

34. An optical communication system according to claim 33, wherein the tunable-filter control apparatus further comprises means for extracting an intensity modulation component of a light output from the tunable-filter, and wherein said error signal generating means comprises means for generating the error signal by comparing a phase of the intensity modulation component of the light output from the tunable-filter with a phase of the modulation signal from said modulation signal supplying means.

35. A tunable-filter control apparatus for tuning a central wavelength of a transmission spectrum of a tunable-filter to a wavelength of a light signal, said apparatus comprising:

modulating signal supplying means for supplying a modulation signal having a modulation amplitude for modulating the central wavelength of the transmission spectrum of the tunable-filter;

error signal generating means for receiving an output signal of the tunable-filter and for generating an error signal based on the received output signal for use in determining the tuning state and the modulation amplitude;

filter control means for generating a filter control signal, wherein said filter control means uses the error signal from said error signal generating means to tune the central wavelength to the light signal wavelength; and monitoring means for monitoring a tuning state of said filter control means, said tuning state comprising a draw-in state and a stable state, and for controlling said modulation signal supplying means so as to increase the modulation amplitude of the modulation signal during the draw-in state and to decrease the modulation amplitude of the modulation signal during the stable state.

36. A tunable-filter control apparatus according to claim 35, further comprising means for extracting an intensity modulation component of a light output from the tunable-filter, the intensity modulation component being generated by modulating the central wavelength of the tunable-filter, and wherein said error signal generating means comprises means for generating the error signal by comparing a phase of the intensity modulation component of the light output from said tunable-filter to a phase of the modulation signal from said modulation signal supplying means.

37. A tunable-filter control apparatus according to claim 35, wherein said monitoring means comprises a reference voltage source and a comparator for monitoring the tuning state by comparing the error signal to a reference voltage supplied by said reference voltage source.

38. A tunable-filter control apparatus according to claim 36, wherein said monitoring means comprises a band pass filter, a reference voltage source that produces a reference voltage and a comparator for monitoring the tuning state by comparing an amplitude of said intensity modulation component output from said band pass filter to the reference voltage produced by said reference voltage source.

39. A tunable-filter control apparatus according to claim 36, wherein said monitoring means comprises a low pass filter, a reference voltage source that produces a reference voltage and a comparator for monitoring the tuning state by comparing an amplitude of said intensity modulation component output from said low pass filter with the reference voltage produced by said reference voltage source.

40. A tunable-filter control apparatus according to claim 35, wherein said monitoring means comprises means for monitoring the tuning state using the error signal.

41. A tunable-filter control apparatus according to claim 35, wherein said monitoring means comprises a variable attenuator to control the modulation signal from said modulation signal supplying means by changing an attenuation factor of said variable attenuator.

42. A tunable-filter control method for tuning a central wavelength of a transmission spectrum of a tunable-filter to a wavelength of a light signal input to the tunable-filter, said method comprising the steps of:

modulating the central wavelength of the transmission spectrum of the tunable-filter with a modulation signal having a modulation amplitude;

generating an error signal based on an output of the tunable-filter modulated by said modulating step for use in determining a tuning direction of the central wavelength of the tunable-filter;

monitoring a tuning state which comprises a draw-in state and a stable state;

determining the modulation amplitude of the modulation signal according to the monitored tuning state.

43. A tunable-filter control method according to claim 42, wherein the determined modulation amplitude in the stable state is smaller than the determined modulation amplitude in the draw-in state.

44. A tunable-filter control method according to claim 42, wherein said monitoring step comprises monitoring the error signal.

45. A tunable-filter control method according to claim 42, wherein said monitoring step comprises comparing with a comparator the error signal to a reference voltage generated by a reference voltage source.

46. A tunable-filter control method according to claim 42, wherein said monitoring step comprises monitoring an amplitude of an intensity modulation component, which is generated by modulating the central wavelength of the tunable-filter, of a light output from the tunable-filter.

47. A tunable-filter control method according to claim 46, wherein the modulation component is extracted by a band pass filter.

48. A tunable-filter control method according to claim 46, wherein the modulation component is extracted by a low pass filter.

49. A tunable-filter control method according to claim 42, wherein said monitoring step comprises monitoring an error rate of the light signal with an error rate measuring circuit.

50. A tunable-filter control method according to claim 42, further comprising a step of comparing a phase of an intensity modulation component, which is generated by modulating the central wavelength of the tunable-filter, of a light output from the tunable-filter to a phase of the modulation signal used in said modulating step, wherein the generated error signal is based on a result of said comparing step.

51. A tunable-filter control method according to claim 42, wherein the tunable-filter comprises a distributed feedback filter.

52. A tunable-filter control method according to claim 42, wherein said modulating step comprises modulating the central wavelength of the tunable-filter with a sinusoidal wave.

53. A tunable-filter control method according to claim 50, wherein said comparing step comprises adjusting a relation between the phase of the intensity modulation component and the phase of the modulation signal with a delay circuit.

54. A tunable-filter control method according to claim 50, wherein said comparing step comprises comparing the phase of the intensity modulation component to the phase of the modulation signal with a synchronous detection device and a multiplier.

55. A tunable-filter control method according to claim 42, further comprising a step of tuning the central wavelength to the light signal wavelength based on the error signal, wherein the central wavelength of the tunable filter is drawn into and stabilized at the wavelength of the light signal using a proportional-integral-differential control type feedback control method.

56. A tunable-filter control method according to claim 42, further comprising a step of tuning the central wavelength of the tunable-filter to the wavelength of the light signal by controlling a bias current injected into the tunable-filter.

57. A tunable-filter control method according to claim 42, further comprising a step of tuning the central wavelength of the tunable-filter to the wavelength of the light signal by controlling a device temperature of the tunable-filter.

58. A tunable-filter control method according to claim 42, wherein said modulating step comprises modulating the central wavelength of the tunable-filter with a modulation signal having phase information.

59. A tunable-filter control method according to claim 42, wherein said modulating step comprises modulating the central wavelength of the tunable-filter with a modulation signal from a modulation signal oscillator, and controlling the modulation signal by changing an attenuation factor of a variable attenuator so as to decrease the modulation amplitude of the modulation signal when the tuning state is changed from the draw-in state to the stable state.

60. A tunable-filter control apparatus for tuning a central wavelength of a transmission spectrum of a tunable-filter to a wavelength of a light signal input to the tunable-filter, said apparatus comprising:

a tunable-filter having a variable central wavelength of a transmission spectrum;

modulation signal supplying means for supplying a modulation signal having a controlled modulation amplitude for modulating the central wavelength of the transmission spectrum of said tunable-filter;

error signal generating means for generating an error signal based on an output of said tunable-filter for use in determining a tuning direction of the central wavelength of the tunable-filter;

filter control means, said filter control means using the error signal from said error signal generating means to tune the central wavelength to the light signal wavelength according to the determined tuning direction;

monitoring means for monitoring a tuning state of said filter control means, said tuning state comprising a draw-in state and a stable state;

wherein the amplitude is controlled so that the modulation amplitude in the stable state will be smaller than the modulation amplitude in the draw-in state.

61. A tunable-filter control apparatus according to claim 60, wherein said monitoring means comprises means for monitoring the tuning state using the error signal.

62. A tunable-filter control apparatus according to claim 60, wherein said monitoring means comprises a reference voltage source that produces a reference voltage and a comparator for monitoring the tuning state by comparing the error signal to the reference voltage produced by said reference voltage source.

63. A tunable-filter control apparatus according to claim 60, wherein said monitoring means comprises means for monitoring an amplitude of an intensity modulation component, which is generated by modulating the central wavelength of the tunable-filter, of a light output from the tunable-filter.

64. A tunable-filter control apparatus according to claim 63, wherein said means for monitoring comprises a band pass filter for extracting the modulation component.

65. A tunable-filter control apparatus according to claim 63, wherein said means for monitoring comprises a low pass filter for extracting the modulation component.

66. A tunable-filter control apparatus according to claim 60, wherein said monitoring means comprises an error rate measuring means for monitoring the tuning state by monitoring a measured error rate obtained by measuring an error rate of a received signal transmitted through said tunable-filter.

67. A tunable-filter control apparatus according to claim 60, further comprising means for extracting an intensity modulation component, which is generated by modulating the central wavelength of the tunable-filter, of a light output from said tunable-filter, and wherein said error signal generating means comprises means for generating the error signal by comparing a phase of the intensity modulation component of the light output from said tunable-filter to a phase of the modulation signal from said modulation signal supplying means.

68. A tunable-filter control apparatus according to claim 60, wherein said tunable-filter comprises a distributed feedback filter.

69. A tunable-filter control apparatus according to claim 60, wherein said modulation signal supplying means supplies a sinusoidal wave.

70. A tunable-filter control apparatus according to claim 67, further comprising a delay circuit for adjusting a relation between the phase of the intensity modulation component and the phase of the modulation signal.

71. A tunable-filter control apparatus according to claim 67, wherein said error signal generating means comprises a synchronous detection device and a multiplier to compare the phase of the intensity modulation component with the phase of the modulation signal.

72. A tunable-filter control apparatus according to claim 60, wherein said filter control means comprises proportional-integral-differential control means for drawing the central wavelength of said tunable-filter into the wavelength of the light signal based on the error signal, and for stabilizing the central wavelength at the light signal wavelength.

73. A tunable-filter control apparatus according to claim 60, wherein said filter control means comprises means for tuning the central wavelength of said tunable-filter to the light signal wavelength by controlling a bias current injected into said tunable-filter.

74. A tunable-filter control apparatus according to claim 60, wherein said filter control means comprises means for tuning the central wavelength of said tunable-filter to the light signal wavelength by controlling a device temperature of said tunable-filter.

75. A tunable-filter control apparatus according to claim 60, wherein said modulation signal supplying means comprises means for supplying a modulation signal having phase information.

76. A tunable-filter control apparatus according to claim 60, wherein said monitoring means comprises a variable attenuator to control the modulation signal from said modulation signal supplying means by changing an attenuation factor of said variable attenuator.

77. A receiver for receiving a light signal comprising:

a tunable-filter having a transmission spectrum with a variable central wavelength;

a tunable-filter control apparatus for tuning the central wavelength of the transmission spectrum of the tunable-filter to a wavelength of the light signal, said tunable-filter control apparatus comprising:

modulation signal supplying means for supplying a modulation signal having a modulation amplitude for modulating the central wavelength of the transmission spectrum of said tunable-filter;

error signal generating means for generating an error signal based on an output of said tunable-filter for use in determining a tuning direction of the central wavelength of the tunable-filter;

filter control means, said filter control means using the error signal from said error signal generating means to tune the central wavelength to the light signal wavelength according to the determined tuning direction;

monitoring means for monitoring a tuning state of said filter control means, said tuning state comprising a draw-in state and a stable state;

wherein the amplitude is controlled so that the modulation amplitude in the stable state will be smaller than the modulation amplitude in the draw-in state.

78. An optical communication system comprising:

a light transmission line;

a transmitter unit, connected to said light transmission line, for transmitting a light signal transmitted through said transmission line; and a receiver unit, also connected to said light transmission line, for receiving a light signal transmitted through said transmission line, said receiver unit comprising:

a tunable-filter having a transmission spectrum with a variable central wavelength;

a tunable-filter control apparatus for tuning the central wavelength of the transmission spectrum of the tunable-filter to a wavelength of the light signal, said tunable-filter control apparatus comprising:

modulation signal supplying means for supplying a modulation signal having a modulation amplitude for modulating the central wavelength of the transmission spectrum of said tunable-filter;

error signal generating means for generating an error signal based on an output of said tunable-filter for use in determining a tuning direction of the central wavelength of the tunable-filter;

filter control means, said filter control means using the error signal from said error signal generating means to tune the central wavelength to the light signal wavelength according to the determined tuning direction;

monitoring means for monitoring a tuning state of said filter control means, said tuning state comprising a draw-in state and a stable state;

wherein the amplitude is controlled so that the modulation amplitude in the stable state will be smaller than the modulation amplitude in the draw-in state.

* * * * *

UNITED STATES PATENT AND TRADEMARK OFFICE
CERTIFICATE OF CORRECTION

PATENT NO. : 5,552,919  
DATED : September 3, 1996  
INVENTOR(S) : Majima et al.

Page 1 of 2

It is certified that error appears in the above-indentified patent and that said Letters Patent is hereby corrected as shown below:

On the title page, item

[56] FOREIGN PATENT DOCUMENTS:

"2135830 5/1990 Japan" should read --2-135830 5/1990 Japan--.

COLUMN 1:

Line 50, "a filter" should read --there is a filter--; and
Line 57, "losing" should read --lasing--.

COLUMN 7:

Line 49, "$\lambda s\sim\Delta/2\lambda s+\Delta/2$" should read --$\lambda s-\Delta/2\sim\lambda s+\Delta/2$--.

COLUMN 10:

Line 54, "filter I11." should read --filter 111.--.

COLUMN 15:

Line 33, "tunable filter," should read --tunable-filter,--.

COLUMN 16:

Line 27, "tunable filter" should read --tunable-filter--; and

UNITED STATES PATENT AND TRADEMARK OFFICE
CERTIFICATE OF CORRECTION

PATENT NO. : 5,552,919  
DATED : September 3, 1996  
INVENTOR(S) : Majima et al.

Page 2 of 2

It is certified that error appears in the above-indentified patent and that said Letters Patent is hereby corrected as shown below:

Line 64, "tunable filter," should read --tunable-filter;--.

COLUMN 20:

Line 9, "state;" should read --state; and--; and  
    Line 64, "tunable filter" should read --tunable-filter--.

COLUMN 21:

Line 37, "direction;" should read --direction; and--.

COLUMN 23:

Line 7, "direction;" should read --direction; and--.

COLUMN 24:

Line 16, "direction;" should read --direction; and--.

Signed and Sealed this

Fifteenth Day of April, 1997

Attest:

BRUCE LEHMAN

*Attesting Officer*      *Commissioner of Patents and Trademarks*